(12) United States Patent
Kakimoto et al.

(10) Patent No.: US 9,263,250 B2
(45) Date of Patent: Feb. 16, 2016

(54) METHOD AND APPARATUS OF FORMING SILICON NITRIDE FILM

(71) Applicant: TOKYO ELECTRON LIMITED, Tokyo (JP)

(72) Inventors: Akinobu Kakimoto, Nirasaki (JP); Kazuhide Hasebe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/506,881

(22) Filed: Oct. 6, 2014

(65) Prior Publication Data
US 2015/0099374 A1 Apr. 9, 2015

(30) Foreign Application Priority Data

Oct. 7, 2013 (JP) .................................. 2013-210456
Aug. 25, 2014 (JP) .................................. 2014-170202

(51) Int. Cl.
| | |
|---|---|
| H01L 21/31 | (2006.01) |
| H01L 21/469 | (2006.01) |
| H01L 21/02 | (2006.01) |
| C23C 16/34 | (2006.01) |
| C23C 16/455 | (2006.01) |
| C23C 16/505 | (2006.01) |
| C23C 16/458 | (2006.01) |

(52) U.S. Cl.
CPC .......... *H01L 21/0217* (2013.01); *C23C 16/345* (2013.01); *C23C 16/45534* (2013.01); *C23C 16/45542* (2013.01); *C23C 16/45551* (2013.01); *C23C 16/505* (2013.01); *H01L 21/0228* (2013.01); *H01L 21/02211* (2013.01); *H01L 21/02274* (2013.01); *C23C 16/4584* (2013.01)

(58) Field of Classification Search
USPC .......................................................... 438/791
See application file for complete search history.

(56) References Cited

U.S. PATENT DOCUMENTS

| | | | |
|---|---|---|---|
| 6,815,350 B2 | 11/2004 | Kim et al. | |
| 2005/0148201 A1* | 7/2005 | Ahn et al. | ..................... 438/778 |
| 2006/0032443 A1 | 2/2006 | Hasebe et al. | |
| 2007/0087581 A1 | 4/2007 | Singh et al. | |
| 2012/0295449 A1* | 11/2012 | Fukazawa | ..................... 438/786 |

FOREIGN PATENT DOCUMENTS

| | | |
|---|---|---|
| JP | 2006-270016 A | 10/2006 |
| JP | 2010-512646 A | 4/2010 |
| JP | 2010-251654 A | 11/2010 |
| JP | 2011-254063 A | 12/2011 |

* cited by examiner

*Primary Examiner* — Asok K Sarkar
(74) *Attorney, Agent, or Firm* — Nath Goldberg & Meyer; Jerald L. Meyer

(57) ABSTRACT

Provided is a method of forming a silicon nitride film on a surface to be processed of a target object, which includes: repeating a first process a first predetermined number of times, the process including supplying a silicon source gas containing silicon toward the surface to be processed and supplying a decomposition accelerating gas containing a material for accelerating decomposition of the silicon source gas toward the surface to be processed; performing a second process of supplying a nitriding gas containing nitrogen toward the surface to be processed a second predetermine number of times; and performing one cycle a third predetermined number of times, the one cycle being a sequence including the repetition of the first process and the performance of the second process to form the silicon nitride film on the surface to be processed.

16 Claims, 20 Drawing Sheets

Step S1

Step S3

Step S6

Step S1

Step S3

Step S6

Step S1

Step S3

Step S6

Comparative example

First embodiment

Comparative example

First embodiment

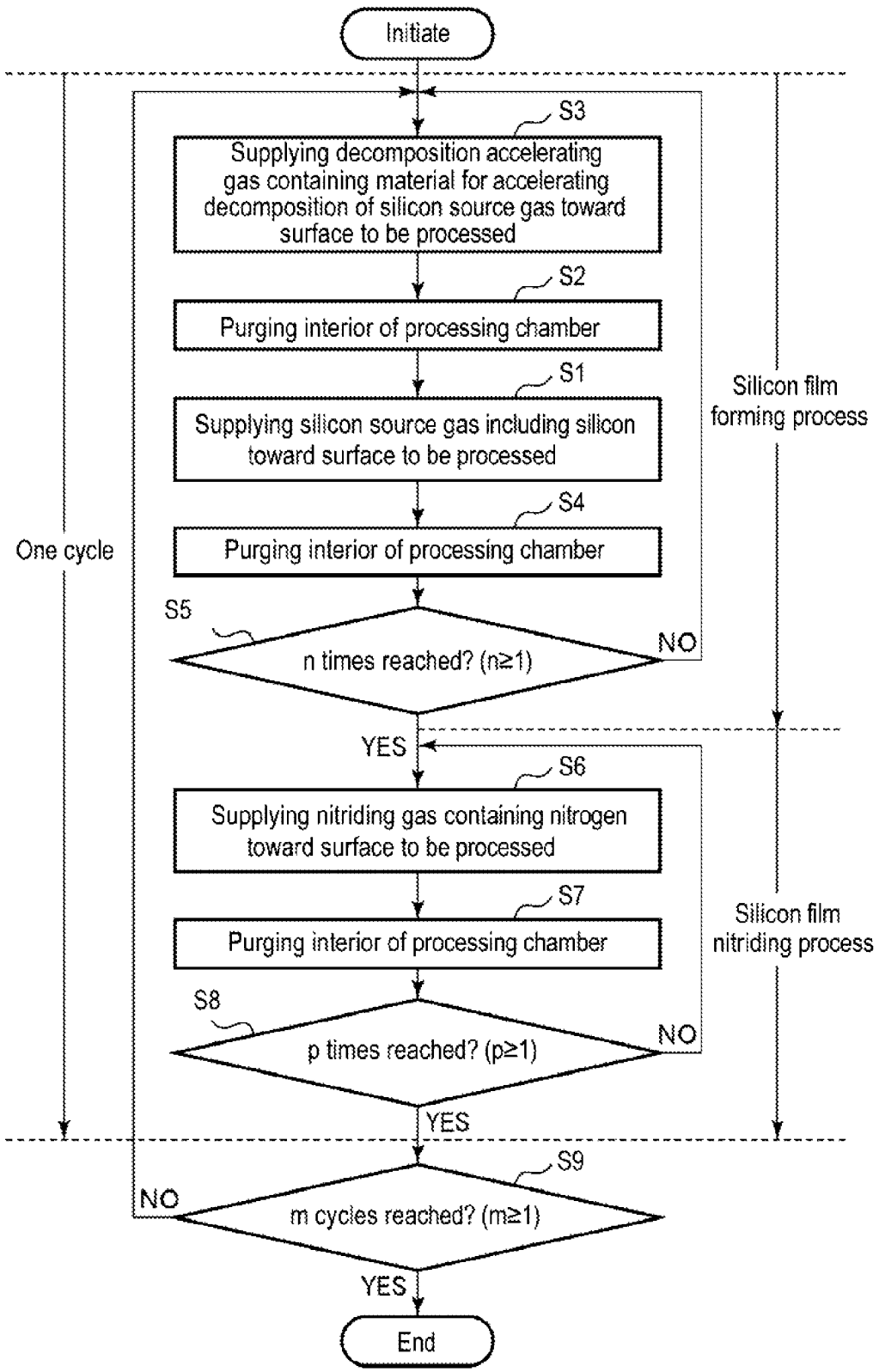

METHOD AND APPARATUS OF FORMING SILICON NITRIDE FILM

CROSS-REFERENCE TO RELATED APPLICATIONS

This application claims the benefit of Japanese Patent Application Nos. 2013-210456 and 2014-170202, filed on Oct. 7, 2013 and Aug. 25, 2014, respectively, in the Japanese Patent Office, the disclosure of which is incorporated herein in their entirety by reference.

TECHNICAL FIELD

The present disclosure relates to a method and apparatus of forming a silicon nitride film.

BACKGROUND

In a semiconductor integrated circuit device, a silicon nitride film has been widely used as a material of an etching stopper, a side wall spacer, a stress liner or the like, as well as as an insulating material of a gate insulating film. In the related art, there are known methods of forming such a silicon nitride film.

There is a first conventional method of forming a silicon nitride film (SiBN film) containing boron (B) as a ternary thin film. In the first conventional method, dichlorosilane (DCS: $SiH_2Cl_2$) is used as a silicon source gas and boron trichloride ($BCl_3$) is used as a boron source gas. Also, the first conventional method includes:

(1) simultaneously supplying the DCS gas and the $BCl_3$ gas into a processing chamber to form a boron-containing silicon film;

(2) purging the interior of the processing chamber;

(3) supplying ammonia ($NH_3$) as a nitriding gas into the processing chamber such that the boron-containing silicon film is nitrided to be changed to plasma, thereby forming the SiBN film; and (4) purging the interior of the processing chamber.

By repeating the processes of (1) to (4), the SiBN film is formed on a surface to be processed of a target object.

The SiBN film formed as above provides the following effects:

a) Better step coverage than that formed using a plasma enhanced chemical vapor deposition (PECVD);

b) A reactive ion etching (RIE)-based etching, that is easier than a typical silicon nitride film ($SiN_x$ film) or a typical boron nitride film (BN film);

Better wet etching resistance than the typical boron nitride film (BN film); and Lower relative dielectric constant than the typical $SiN_x$ film.

Further, there is a second conventional method for forming a boron-containing silicon nitride film (SiBN). In the second method, like the first conventional method, DCS is used as a silicon source gas and $BCl_3$ is used as a boron source gas. The second conventional method includes:

(1) supplying the DCS gas into a processing chamber to form a silicon film;

(2) purging the interior of the processing chamber;

(3) supplying $NH_3$ as a nitriding gas into the processing chamber such that the silicon film is nitrided or is changed to plasma, thereby forming the silicon nitride film;

(4) purging the interior of the processing chamber;

(5) supplying $BCl_3$ as the boron source gas into the processing chamber to add boron to the silicon nitride film, thereby forming the SiBN film;

(6) purging the interior of the processing chamber;

(7) supplying $NH_3$ as a nitriding gas into the processing chamber such that the boron-containing silicon nitride film is further nitrided by $NH_3$ activated by plasma and a residual Cl component derived from the $BCl_3$ gas is removed from an SiBN film; and (8) purging the interior of the processing chamber.

By repeating the processes of (1) to (8), the SiBN film is formed on a surface to be processed of a target object.

The SiBN film formed as above provides the following effects:

Better etching resistance by the $NH_3$ activated by plasma, compared with a case where the silicon nitride film is not further plasma-nitirided; and Lower relative dielectric constant than a typical $SiN_x$ film.

In the second method, diborane ($B_2H_6$) and trimethylboron ($B(CH_3)_3$) containing no halogen element, may be used as the boron source gas, in addition to the $BCl_3$ gas.

Also, there is a third conventional method of forming a boron-containing silicon film (SiBN). In the third conventional method, monosilane ($SiH_4$) is used as the silicon source gas and $BCl_3$ is used as the boron source gas. In the third conventional method includes:

(1) supplying an $SiH_4$ gas into a processing chamber to form a silicon film;

(2) purging the interior of the processing chamber;

(3) supplying the $BCl_3$ gas into the processing chamber such that boron is adsorbed onto a surface of the silicon film, thereby forming the boron-containing silicon film; and (4) purging the interior of the processing chamber.

By repeating the processes of (1) to (4), the boron-containing silicon film is formed on a surface to be processed of a target object.

The boron-containing silicon film formed as above provides the following effects:

The silicon film can be formed at lower temperature (e.g., about 350 degrees C.) due to the boron atom acting as a catalyst, compared with the formation of a silicon film using the $SiH_4$ gas alone; and It is obtained good step coverage even at the lower temperature.

Also, in the third conventional method, a $B_2H_6$ gas containing no halogen element may be used as the boron source gas, in addition to the $BCl_3$ gas.

Recently, user's demand for a film forming apparatus has been impressively changed. Such a demand includes "enhancement of productivity of the film forming apparatus." The enhancement of productivity defines maintaining and enhancing the better step coverage, achieving the electrical and physical characteristics required for thin films, and obtaining both the better processability and the better etching resistance, which are imposed on the first and second conventional methods.

So far, the enhancement of productivity has mainly been focused on improving so-called hardware, such as an increase in speed of a transfer robot, an increase in control speed of a temperature in a heating device or a cooling device, and the like. Unfortunately, in recent years, the hardware improvement alone makes it difficult to meet the user's demand for productivity.

SUMMARY

Some embodiments of the present disclosure provide a silicon nitride film forming method capable of enhancing productivity of a film forming apparatus, while satisfying user's demands such as film uniformity, electrical or physical characteristics and processability, without relying only on hardware improvement, and a film forming apparatus configured to perform the film forming method.

According to one embodiment of the present disclosure, provided is a method of forming a silicon nitride film on a surface to be processed of a target object, which includes: repeating a first process a first predetermined number of times, the process including supplying a silicon source gas containing silicon toward the surface to be processed and supplying a decomposition accelerating gas containing a material for accelerating decomposition of the silicon source gas toward the surface to be processed; performing a second process of supplying a nitriding gas containing nitrogen toward the surface to be processed a second predetermine number of times; and performing one cycle a third predetermined number of times, the one cycle being a sequence including the repetition of the first process and the performance of the second process to form the silicon nitride film on the surface to be processed.

According to another embodiment of the present disclosure, provided is a method of forming a silicon nitride film on a surface to be processed of a target object, which includes: supplying a decomposition accelerating gas toward the surface to be processed, and supplying a silicon source gas containing silicon toward the surface to be processed, the decomposition accelerating gas containing a material for accelerating decomposition of the silicon source gas; supplying a nitriding gas containing nitrogen toward the surface to be processed; and performing one cycle a predetermined number of times, the one cycle being a sequence including the supply of the decomposition accelerating gas and the silicon source gas and the supply of the nitriding gas to form the silicon nitride film on the surface to be processed.

According to another embodiment of the present disclosure, provided is an apparatus of forming a silicon nitride film on a surface to be processed of a target object, which includes: a processing chamber configured to perform a film forming process on the target object; a silicon source gas supply mechanism configured to supply a silicon source gas into the processing chamber; a decomposition accelerating gas supply mechanism configured to supply a decomposition accelerating gas into the processing chamber; a nitriding gas supply mechanism configured to supply a nitriding gas into the processing chamber; and a heating unit configured to heat the processing chamber; and a control unit configured to control the silicon source gas supply mechanism, the decomposition accelerating gas supply mechanism, the nitriding gas supply mechanism, and the heating unit such that the silicon nitride film forming method of Claim 1 is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a flowchart showing an example of a silicon nitride film forming method according to a second embodiment of the present disclosure.

DETAILED DESCRIPTION

Figure 1:
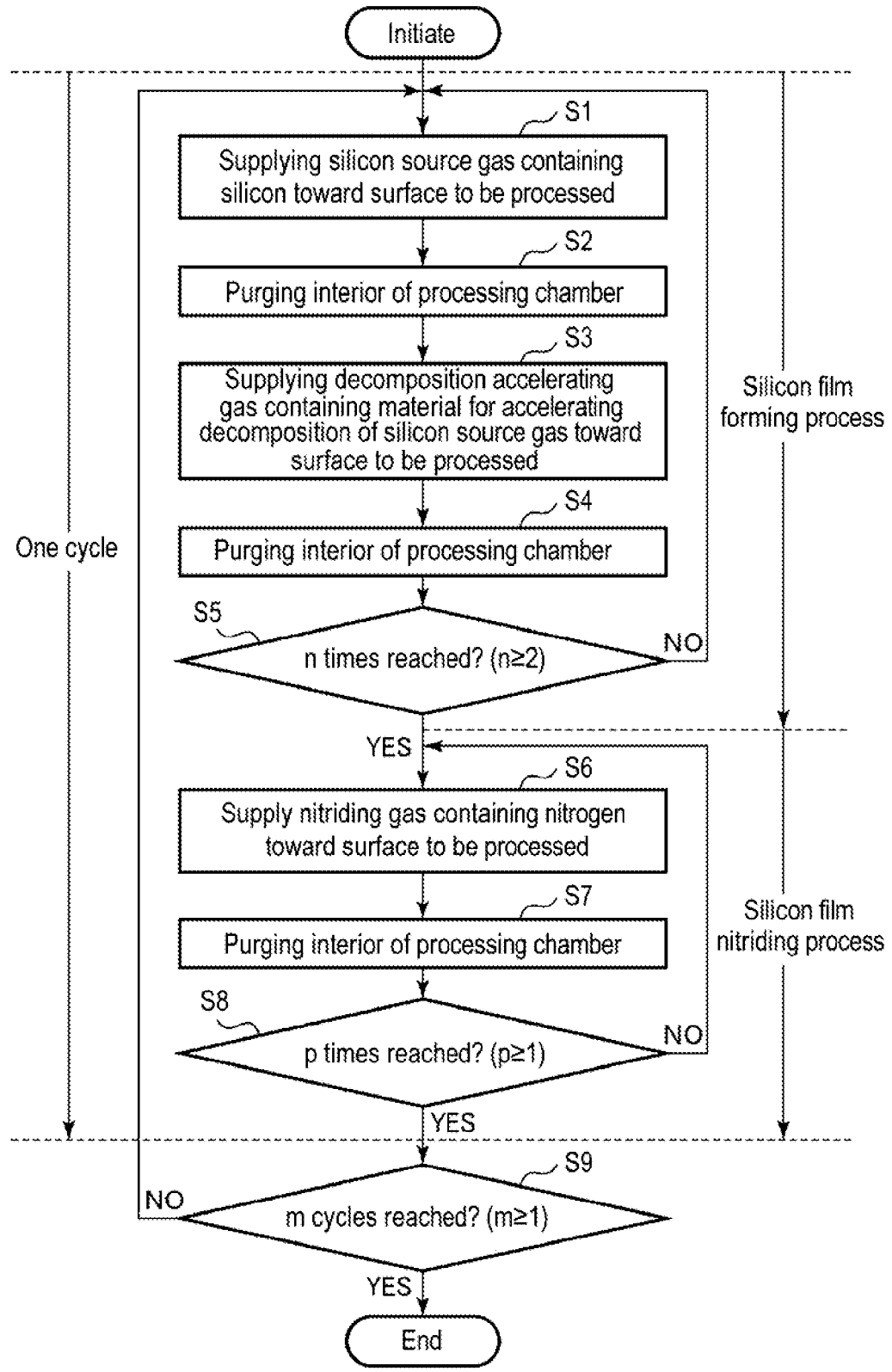
FIG. 1 is a flowchart showing an example of a silicon nitride film forming method according to a first embodiment of the present disclosure.

In order to enhance productivity of a film forming apparatus, the inventors of the present disclosure focused on improving a film forming sequence of a silicon nitride film, i.e., a software improvement. Also, the inventors of the present disclosure overcame the limits in which forming a silicon nitride film by using an alternate supply method such as an atomic layer deposition (ALD) method requires repeating one cycle including "supplying a silicon source gas one time and supplying a nitriding gas one time" more than once. As a result, a silicon nitride film forming method which is capable of enhancing productivity of the film forming apparatus, while satisfying user's demands for film uniformity, electrical characteristics, processability and the like, without relying on hardware improvement, was realized.

Hereinafter, embodiments of the present disclosure will be described with reference to the drawings. Further, in the drawings, like reference numerals indicate like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Film Forming Method

Figure 2A:
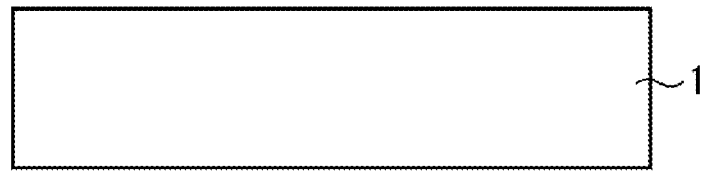
FIGS. 2A to 2N are cross-sectional views showing major processes of the example of the silicon nitride film forming method according to the first embodiment of the present disclosure.

FIG. 1 is a flowchart showing a silicon nitride film forming method according to a first embodiment of the present disclosure. FIGS. 2A to 2N are cross-sectional views showing major processes of the film forming method.

In the first embodiment, a silicon substrate (silicon wafer=silicon single crystal) 1 is used as an example of an underlying film on which a silicon nitride film is formed (see FIG. 2A). The underlying film is not limited to the silicon substrate 1, but may be an insulating film such as a silicon oxide film, or a conductive film such as a metal film. In the first embodiment, the silicon nitride film (which will be described later) is formed on a surface to be processed of the silicon substrate 1.

Subsequently, the silicon substrate 1 is carried into a processing chamber of the film forming apparatus (which will be described later) where a "silicon film forming process" is performed as a first step. To do this, a silicon source gas containing silicon is supplied toward the surface to be processed of the silicon substrate 1 received in the processing chamber (step S1 of FIG. 1). In the first embodiment, a monosilane ($SiH_4$) gas is used as the silicon source gas.

An example of processing conditions in step S1 is follows as:
  Flow rate of monosilane: 1000 sccm
  Processing time: 30 sec
  Processing temperature: 200 degrees C.
  Processing pressure: 133 Pa (1 Torr) (wherein, 1 Torr is defined as 133 Pa)

Figure 2B:
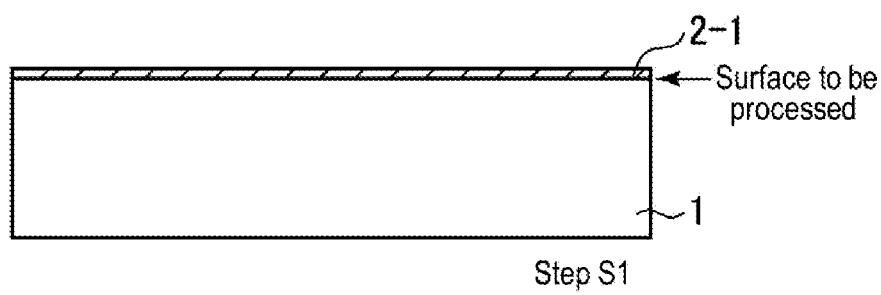

Such processing conditions thermally decompose the $SiH_4$ gas so that the $SiHf_4$ gas is adsorbed onto the surface to be processed of the silicon substrate 1, thus forming a first silicon layer 2-1 (see FIG. 2B). The first silicon layer 2-1 has a thin thickness of tens of atomic layers, for example.

The silicon source gas is not limited to the $SiH_4$ gas, but any silicon compound gas may be used as long as it contains silicon. As an example, a so-called high-order silane gas having two or more number of silicon, such as a $Si_2H_6$ gas, a $Si_3H_8$ gas or the like, may be used as a silane-based gas. In this embodiment, the silane-based gas is defined as both a monosilane gas having one silicon and a high-order silane gas having two or more silicon.

In some embodiments, examples of the silicon source gas may include a silicon compound gas in which a hydrogen atom of the silane-based gas is substituted with an atom other than the hydrogen atom. As an example, the silicon source gas may be the following gases with the hydrogen atom of the silane-based gas substituted by a chlorine atom:
  $SiH_3Cl$ gas,
  $SiH_2Cl_2$ gas,
  $SiHCl_3$ gas,
  $Si_2H_5Cl$ gas,
  $Si_2H_4Cl_2$ gas,
  $Si_2H_3Cl_3$ gas,
  $Si_2H_2Cl_4$ gas,
  $Si_2HCl_5$ gas, or the like.

Thereafter, the processing chamber is exhausted, and simultaneously, an inert gas is supplied into the processing chamber to purge the interior of the processing chamber (step S2 of FIG. 1). Examples of the inert gas may include a nitrogen ($N_2$) gas or a rare gas such as an argon (Ar) gas.

Subsequently, a decomposition accelerating gas which contains a material for accelerating decomposition of the silicon source gas is supplied toward the surface to be processed of the silicon substrate 1 received in the processing chamber (step S3 of FIG. 1). An example of the material for accelerating the decomposition of the silicon source gas may be boron (B). In the first embodiment, a diborane ($B_2H_6$) gas is used as the decomposition accelerating gas.

An example of processing conditions in step S3 is as follows:
  Flow rate of diborane: 200 sccm
  Processing time: 30 sec
  Processing temperature: 200 degrees C.
  Processing pressure: 133 Pa (1 Torr)

Figure 2C:
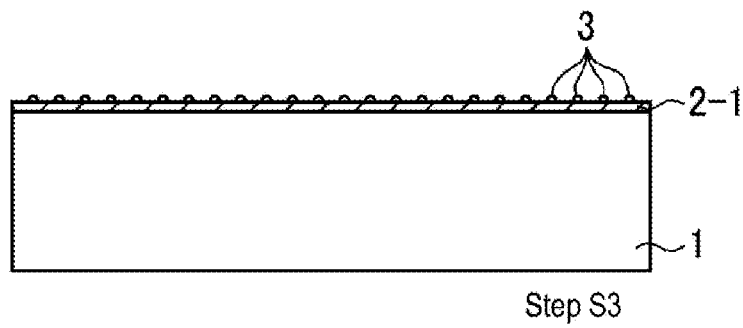

Thus, boron atoms 3 are adsorbed onto the first silicon layer 2-1 (see FIG. 2C). The boron atoms 3 adsorbed onto the first silicon layer 2-1 functions as a catalyst to accelerate the decomposition of the silicon compound gas (the $SiH_4$ gas in the first embodiment). With this configuration, even at a low temperature of 100 to 400 degrees C., for example, the $SiH_4$ gas can be decomposed faster than a case where none of the boron atoms 3 are adsorbed.

The decomposition accelerating gas is not limited to the $B_2H_6$ gas, but any boron compound gas may be used as long as it contains boron. As an example, the decomposition accelerating gas may be a $BH_3$ (monoborane) gas. Further, a so-called high-order borane gas, in which the number of boron is two or more, may be used as the decomposition accelerating gas. In this embodiment, the borane-based gas is defined as both a monoborane gas having one boron and a high-order borane gas having two or more boron.

In some embodiments, a boron compound gas with a hydrogen atom of the borane-based gas substituted by an atom other than hydrogen may be used as the decomposition accelerating gas. As an example, the following gases with a boron atom of the borane-based gas substituted by a chlorine atom may also be used:
  $BCl_3$ gas,
  $(B(C_2H_5))_3$ gas, or the like.

Subsequently, the processing chamber is exhausted, and simultaneously, an inert gas is supplied into the processing chamber to purge the interior of the processing chamber (step S4 of FIG. 1). This inert gas may be identical to that used in step S2.

Thereafter, as shown in step S5 of FIG. 1, it is determined whether the number of repetitions of a sequence of step S1 to step S4 has reached a predetermined set value n (where n is 2 or greater). If the result of the determination is NO, the sequence of step S1 to step S4 is resumed. If the result of the determination is YES, the process proceeds to step S6.

Figure 2D:
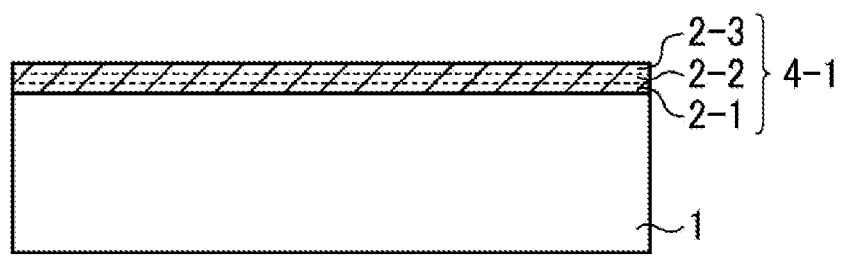

In this manner, by repeating the sequence of step S1 to step S4 two or more times, a first silicon film 4-1 is formed on the surface to be processed of the silicon substrate 1. FIG. 2D shows an example in which the first silicon film 4-1 including the first silicon layer 2-1, a second silicon layer 2-2 and a third silicon layer 2-3 is formed by repeating the sequence of step S1 to step S4 three times under the condition that the predetermination set value n is set to "3". Also, in FIG. 2D, the boron atoms 3 to be adsorbed onto the third silicon layer 2-3 in step S3 are omitted.

Subsequently, a "silicon film nitriding process" as a second step is performed within the processing chamber where the "the silicon film forming process" has been performed. To do this, within the processing chamber, a nitriding gas containing nitrogen is supplied to the surface to be processed of the silicon substrate 1 on which the first silicon film 4-1 is formed (step S6 of FIG. 1). In the first embodiment, an ammonia (NH$_3$) gas is used as the nitriding gas. Also, in the first embodiment, energy is applied to the NH$_3$ gas to produce an active nitrogen containing, for example, a nitrogen radical N*, an ammonia radical NH*, etc. The active nitrogen is supplied toward the surface to be processed of the silicon substrate 1. An example of the energy applied to the NH$_3$ gas may be a high-frequency electric field. As a method (or mechanism) for generating the high-frequency electric field, for example, a parallel-flat type RF plasma generation mechanism configured to generate the high-frequency electric field between two electrode plates disposed to face each other may be used.

An example of processing conditions in step S6 is as follows:

Flow rate of ammonia: 1000 sccm
Processing time: 10 sec
Processing temperature: 200 degrees C.
Processing pressure: 133 Pa (1 Torr)
High-frequency electric: ON Thus, for example, the first silicon film 4-1 is radical-nitrided such that a first silicon nitride film 5-1 is formed (see FIG. 2E).

The nitriding gas is not limited to the NH$_3$ gas, but any nitrogen compound gas may be used as long as it contains nitrogen. As an example, hydrazine (N$_2$H$_4$), hydrazine derivative, or the like may be used as the nitriding gas. In some embodiments, a nitrogen gas alone may be used as the nitriding gas.

Further, the high-frequency electric field generating method (or mechanism) is not limited to the parallel-flat type RF plasma generation mechanism. As an example, a silent discharge, a radial rod slot antenna or the like may be used.

Thereafter, the high-frequency electric field is turned off, followed by exhausting the processing chamber, followed by supplying an inert gas into the processing chamber, thus purging the interior of the processing chamber (step S7 of FIG. 1). This inert gas may be identical to that used in step S2.

Subsequently, as shown in step S8 of FIG. 1, it is determined whether the number of repetitions of a sequence of step S6 and step S7 has reached a predetermined set value p (where p is 1 or greater). If the result of the determination is NO, the sequence of step S6 and step S7 is resumed. If the result of the determination is YES, the process proceeds to step S9.

Figure 2E:
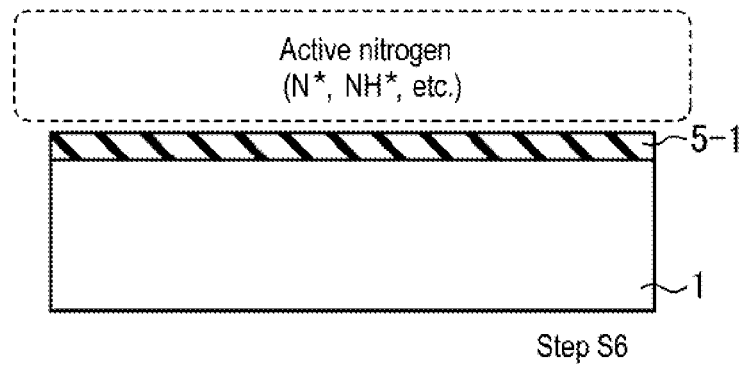

In this manner, by repeating the sequence of step S6 and step S7 one or more times, the first silicon film 4-1 is nitrided so that the first silicon nitride film 5-1 is formed on the surface to be processed of the silicon substrate 1. FIG. 2E shows an example in which the first silicon film 4-1 is nitrided by performing the sequence of step S6 and step S7 once under the condition that the predetermined set value p is set to "1."

Further, in the first embodiment, the number of repetitions of the nitriding process has been described to be set to a limited value of one or more. In some embodiments, when the number of repetitions of the nitriding process is set to be one, step S8 may be omitted in a silicon nitride film forming recipe. That is, the recipe may be prepared such that step S9 is performed to follow step S7.

In the first embodiment, the sequence of steps S1 to S8 (or S7) is defined as one cycle including the silicon film forming process (the sequence of steps S1 to S5) in which the plurality of silicon layers 2-1, 2-2 and 2-3 are formed and the silicon film nitriding process (the sequence of steps S6 to S8 (or S7)).

Subsequently, as shown in step S9 of FIG. 1, it is determined whether the number of repetitions of the one cycle has reached a predetermined set value m (where m is 1 or greater). If the result of the determination is NO, the sequence of steps S1 to S8 (or S7) is resumed. If the result of the determination is YES, the process of the silicon nitride film forming method according to the first embodiment is terminated.

In the first embodiment, the predetermined set value m is set to "3" for example such that and the one cycle including the silicon film forming process (the sequence of steps S1 to S5) in which the plurality of silicon layers 2-1, 2-2 and 2-3 are formed and the silicon film nitriding process (the sequence of steps S6 to S8 (or S7)) is performed three times.

Figure 2F:
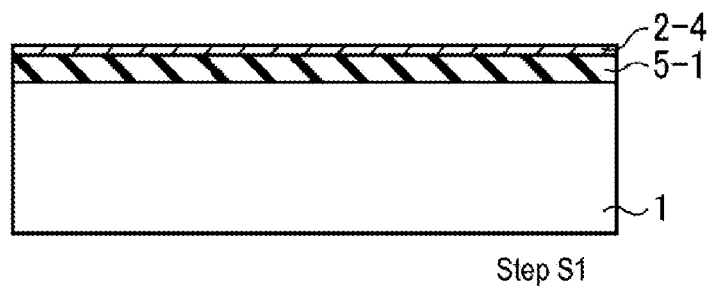
Figure 2G:
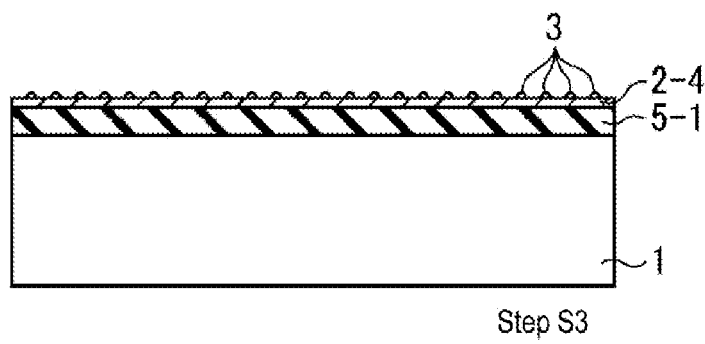
Figure 2H:
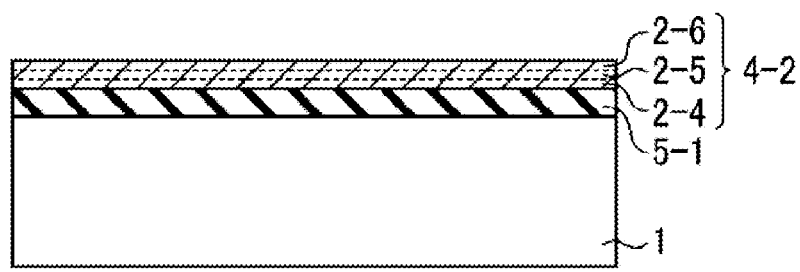

Thus, first, as shown in FIGS. 2F to 2H, by repeating the sequence of steps S1 to S4 three times (the predetermined set value n=3), a second silicon film 4-2 including a fourth silicon layer 2-4, a fifth silicon layer 2-5 and a sixth silicon layer 2-6 is formed on the first silicon nitride film 5-1.

Figure 2I:
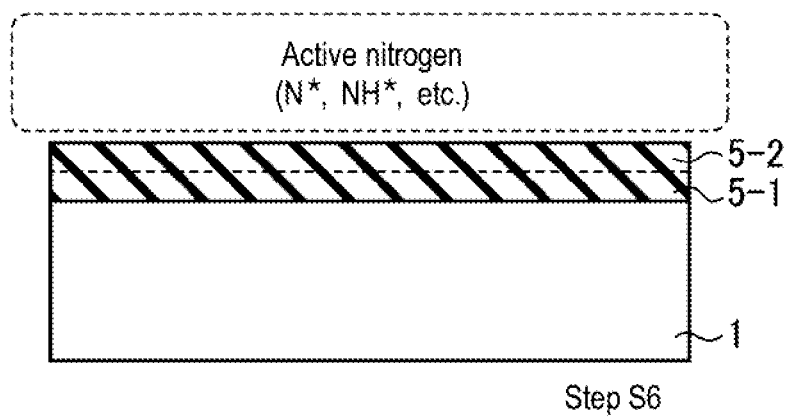

Subsequently, as shown in FIG. 2I, by performing the sequence of steps S6 and S7 once (the predetermined set value p=1), the second silicon film 4-2 is radical-nitrided to form a second silicon nitride film 5-2.

Figure 2J:
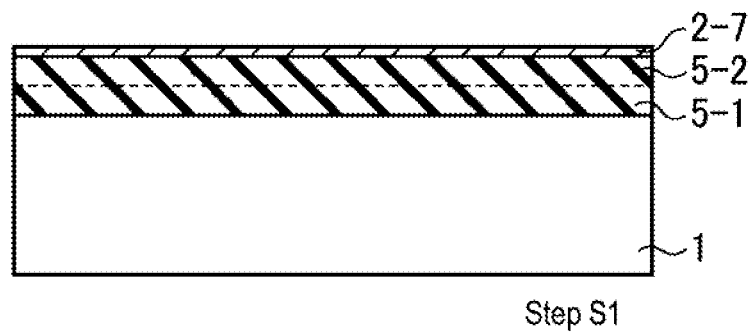
Figure 2K:
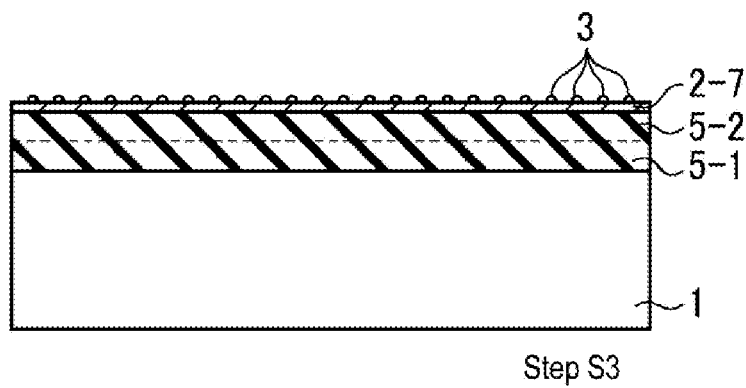
Figure 2L:
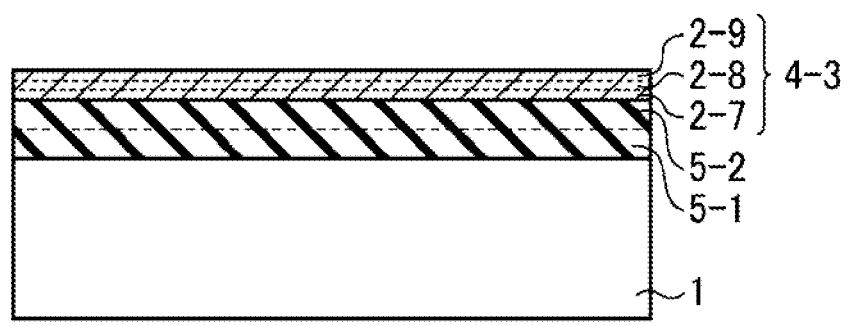

Thereafter, as shown in FIGS. 2J to 2L, the sequence of steps S1 to S4 is repeatedly performed three times again such that a third silicon film 4-3 including a seventh silicon layer 2-7, an eighth silicon layer 2-8 and a ninth silicon layer 2-9 is formed on the second silicon nitride film 5-2.

Figure 2M:
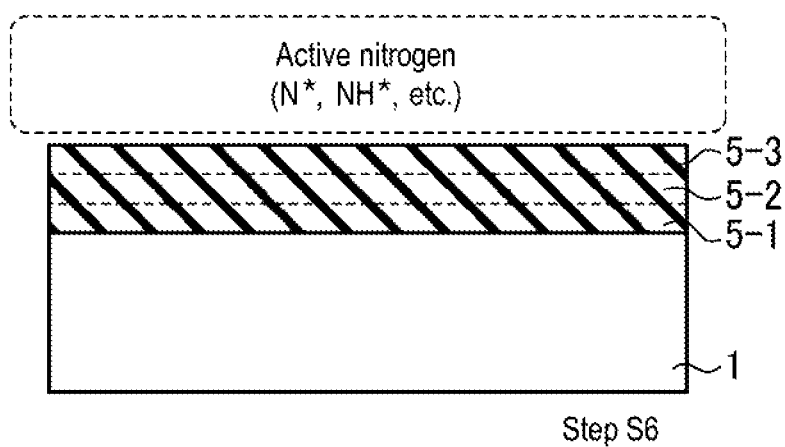
Figure 2N:
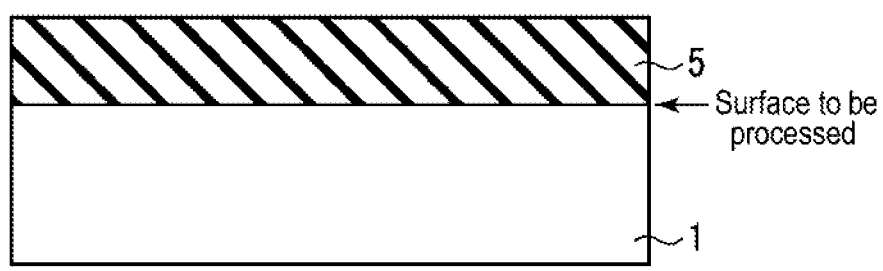

Subsequently, as shown in FIG. 2M, by repeating the sequence of steps S6 and S7 once, the third silicon film 4-3 is radical-nitrided to form a third silicon nitride film 5-3.

In this manner, as shown in FIG. 2N, a silicon nitride film 5 is formed on the surface to be processed of the silicon substrate 1.

The silicon nitride film forming method according to the first embodiment can provide the following effects.

(Enhancement of Throughput)

Figure 3:
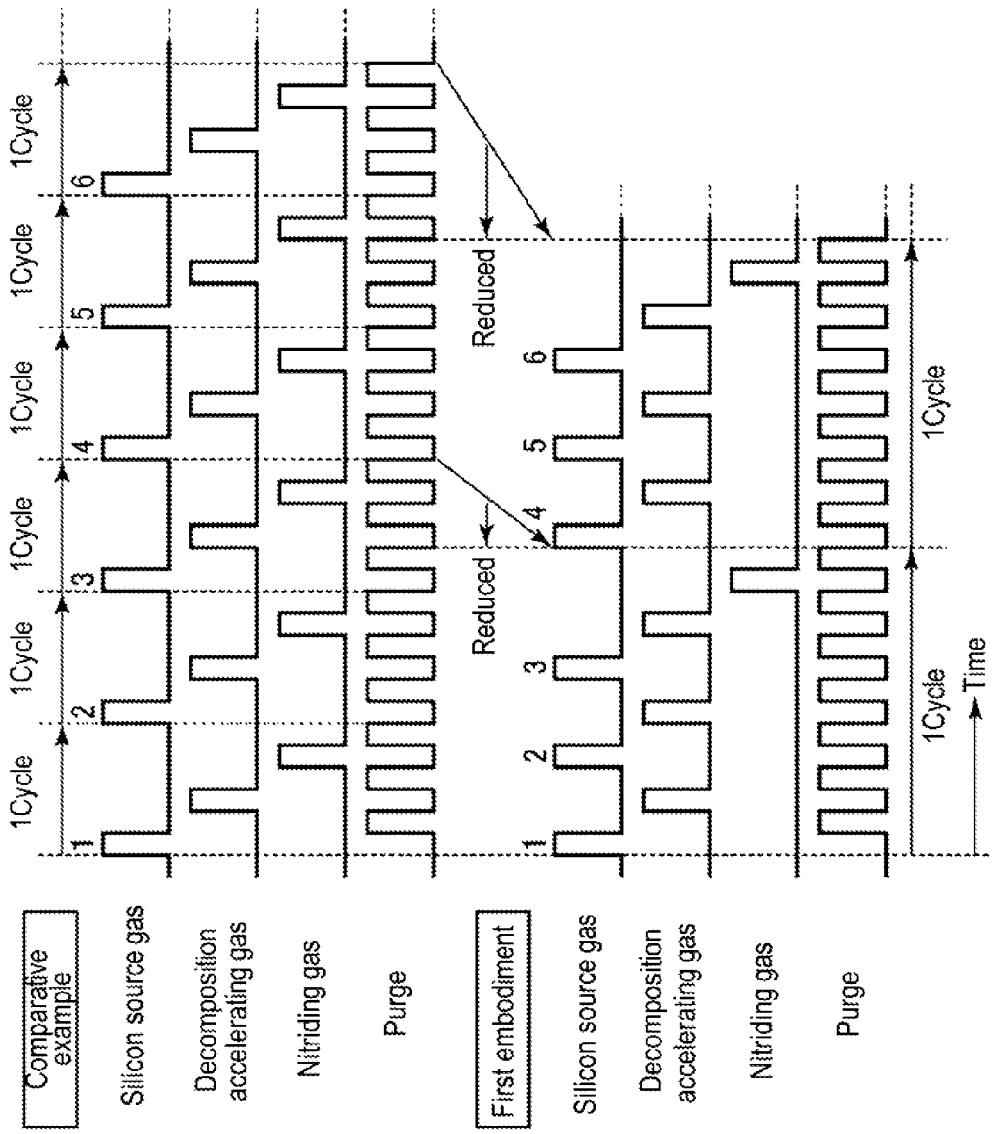
FIG. 3 is a time chart showing a sequence of the silicon nitride film forming method.

FIG. 3 is a time chart showing sequences of the silicon nitride film forming method. In FIG. 3, the silicon nitride film forming method according to the first embodiment and a silicon nitride film forming method according to a comparative example are shown to be compared on a time axis. In the film forming method according to the comparative example, one cycle is set to include supplying a silicon source gas, a decomposition accelerating gas and a nitriding gas one time, respectively. The one cycle is repeated a plurality of times. Also, it is assumed that a supply time of the silicon source gas, a supply time of the decomposition accelerating gas, a supply time of the nitriding gas and a purge time are the same in both the first embodiment and the comparative example.

As shown in FIG. 3, in the silicon nitride film forming method according to the first embodiment, the one cycle is set to include "supplying the silicon source gas and the decomposition accelerating gas a plurality of times, respectively" and "supplying the nitriding gas one time". With this configuration, compared with the comparative example in which one cycle includes "supplying the silicon source gas, the decomposition accelerating gas and the nitriding gas one time, respectively," the number of the supply of the nitriding gas can be reduced. For example, in the first embodiment, each of the silicon source gas and the decomposition accelerating gas is supplied three times while the nitriding gas is supplied one time, which makes it possible to reduce the supply of the nitriding gas and the purging process twice, respectively. This shortens a processing time. Further, the shortened processing time is accumulated each time the one cycle is repeated. Thus, assuming that the silicon nitride film is formed by supplying the silicon source gas and the decomposition accelerating gas 60 times, the following results is obtained:

Comparative example: supplying the nitriding gas 60 times

First embodiment: supplying the nitriding gas 20 times

Thus, according to the first embodiment, the number of the supply of the nitride gas and the purging process can be reduced as many as 40 times less than that of the comparative example, which makes it possible to shorten the processing time as much.

Also, assuming that the silicon nitride film is formed by supplying the silicon source gas 120 times, the following results is obtained:

Comparative example: supplying the nitriding gas 120 times

First embodiment: supply the nitriding gas 40 times

In this case, according to the first embodiment, the number of the supply of the nitriding gas and the purging process can be reduced as many as 80 times less than that of the comparative example.

As described above, the shortening of the processing time according to the first embodiment increases as the number of the supply of the silicon source gas increases.

(Good Step Coverage)

Figure 4:
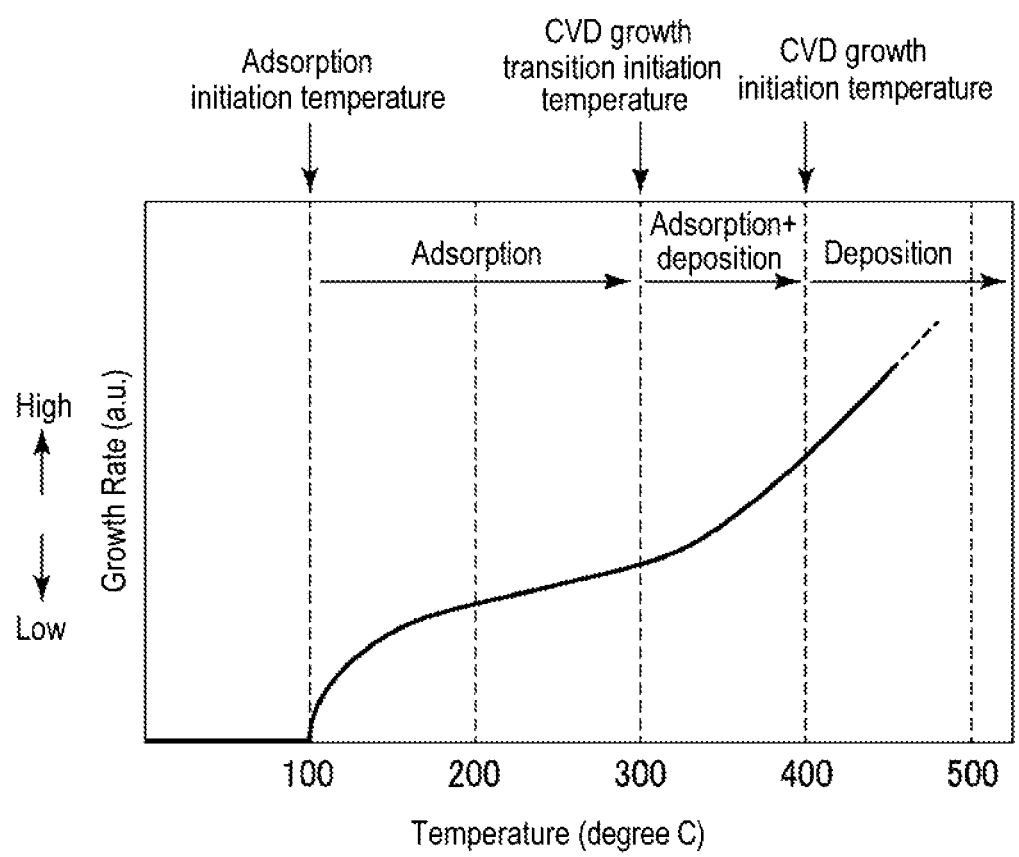
FIG. 4 is a view showing an example of a relationship between a temperature and a growth rate of silicon.

In the comparative example, shortening the processing time requires increasing an amount of a silicon film to be formed by a single supply of the silicon source gas and decreasing the number of cycle required to form a desired thickness of the silicon film based on a design value. To this end, it is necessary to increase a film formation temperature up to a temperature at which silicon initiates to a chemical mechanical deposition (CVD) growth, thereby increasing a growth rate. As for the growth rate and the film formation temperature, the growth rate tends to increase as the film formation temperature increases. FIG. 4 shows an example of a relationship between a film formation temperature and a growth rate of silicon.

Microscopically analyzing that the tendency for the growth rate to increase as the film formation temperature increases, as shown in FIG. 4, a slight "fluctuation" appears in the growth rate at a range of temperature of less than 400 degrees C. Specifically, as shown in FIG. 4, the growth rate of the silicon starts to increase to about 100 degrees C. and continues to gradually increase to about 300 degrees C. When the film formation temperature exceeds 300 degrees C., the growth rate starts to go up. When the film formation temperature exceeds 400 degrees C., the growth rate rapidly increases.

Such a "fluctuation" is estimated to occur as a function of whether the silicon is adsorbed onto or deposited on an underlying film. For example, at a temperature of 100 degrees C. to 300 degrees C., it is considered that the silicon is only adsorbed onto the underlying film or the adsorption of the silicon becomes dominant. Further, it is considered that, in a temperature of 300 degrees C. or higher, silicon is further deposited on the adsorbed silicon, that is, the silicon initiates to the CVD growth, although being a few. Also, at a temperature of 400 degrees C. or higher, deposition of the silicon becomes dominant so that the silicon initiates to an almost complete CVD growth.

Figure 5A:
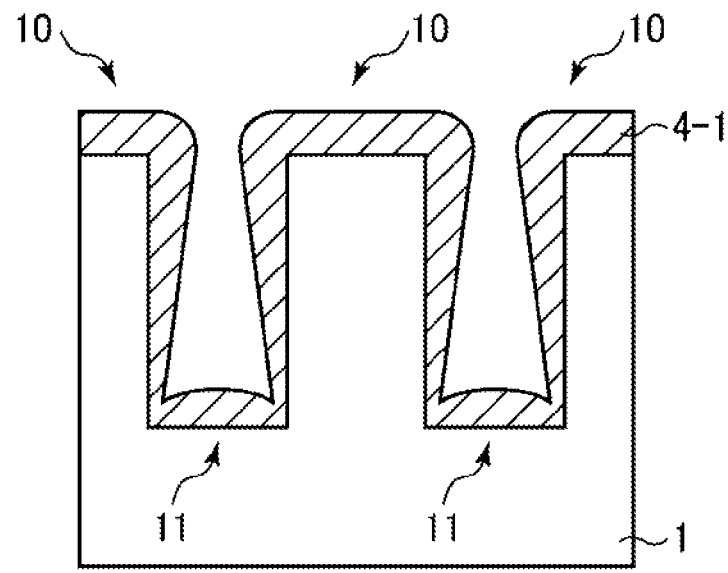
FIG. 5A is a cross-sectional view showing a step coverage according to a comparative example.

Thus, in order to increase a film forming rate of the silicon when the silicon source gas is supplied one time, the film formation temperature is required to be maintained at 400 degrees C. or higher. However, once the silicon initiates to the CVD growth, as shown in FIG. 5A, for example, coatability (or step coverage) of convex portions 10 or concave portions 11 in the first silicon film 4-1, which are formed on the surface to be processed of the substrate 1, may be degraded.

According to the first embodiment, the film formation temperature of the silicon is not necessarily increased to a temperature at which the CVD growth initiates in order to shorten the processing time.

Figure 5B:
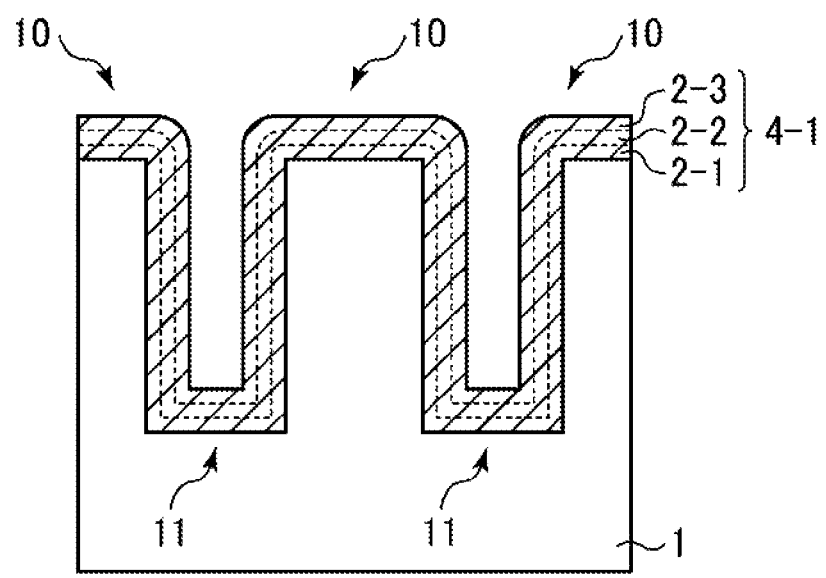
FIG. 5B is a cross-sectional view showing a step coverage according to the first embodiment.

Therefore, as shown in FIG. 5B, the first silicon film 4-1 can be formed while maintaining the good step coverage. Such an advantage may still be obtained for the second silicon film 4-2 or a silicon film to be formed one the second silicon film 4-2. As a result, the thick silicon nitride film 5, which is formed by sequentially nitriding the silicon films 4-1, 4-2, . . . , each having good step coverage, has also good step coverage.

(Suppressing Penetration of Nitrogen)

Figure 6A:
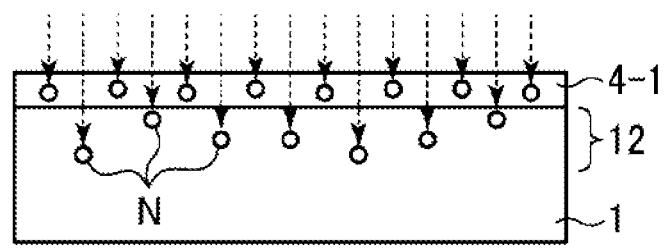
FIG. 6A is a cross-sectional view showing an example where nitrogen elements penetrate in the comparative example.

In the comparative example, the first silicon film 4-1 formed when the film formation temperature of the silicon is not increased up to the CVD growth initiation temperature has a very thin thickness. As such, upon nitriding the first silicon film 4-1, as shown in FIG. 6A, nitrogen atoms N may penetrate through the first silicon film 4-1 to reach the underlying film. Upon penetrating the nitrogen atoms N, in a case where the underlying film is the silicon substrate 1, a region near the surface to be processed of the silicon substrate 1 may be modified into a silicon nitride 12. In addition, in a case where the underlying film is silicon oxide, the region near the surface to be processed may be modified into silicon oxynitride. That is, the comparative example has a high likelihood that the underlying film is modified into another material.

Figure 6B:
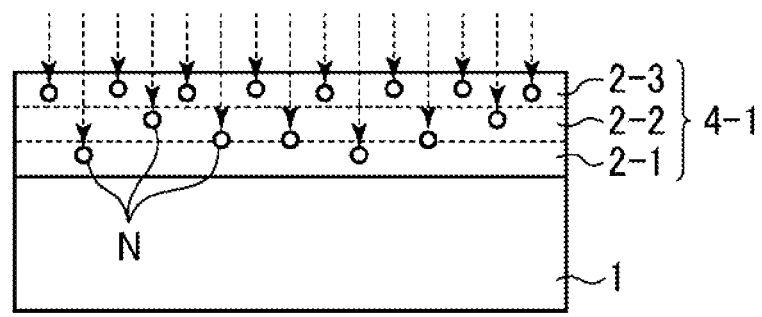
FIG. 6B is a cross-sectional view showing an example where nitrogen elements penetrate according to the first embodiment.

Under these circumstances, according to the first embodiment, the first silicon film 4-1 is obtained by stacking the plurality of silicon layers 2-1 to 2-3. This allows the first silicon film 4-1 to have a sufficient thickness enough to suppress the penetration of the nitrogen atoms N. Further, as shown in FIG. 6B, in the case where the first silicon film 4-1 has the sufficient thickness enough to suppress the penetration of the nitrogen atoms N, when performing the nitriding process, it is possible to suppress the nitrogen atoms N contained in the first silicon film 4-1 from reaching the underlying film, (e.g., the silicon substrate 1), which makes it possible to reduce the modification of the underlying film into another material.

(Improved Controllability for Concentration of Nitrogen Contained in Silicon Nitride Film)

A stoichiometric composition ratio of a silicon nitride film is "Si:N=3:4 ($Si_3N_4$)." However, the silicon nitride film may have various composition ratios depending on a film forming method. Also, a concentration of nitrogen contained in the silicon nitride film, that is, the composition of the silicon nitride film influences, for example, a film stress. As an example, for a Si-rich composition (in the $Si_3N_4$ composition), the film stress is small, while for the N-rich composition (in the $Si_3N_4$ composition), the film stress increases.

With regards to the silicon nitride film forming method according to the first embodiment, the concentration of the nitrogen can be controlled by changing a supply time and a flow rate of the nitriding gas in the silicon film nitriding process (the sequence of steps S6 and S7), and the number of the sequence of steps S6 and S7. In some embodiments, the concentration of the nitrogen can be controlled by changing the number of repetitions of the silicon film forming process (the sequence of steps S1 to S4).

As an example, when one cycle includes "supplying the silicon source gas once" and "supplying the nitriding gas once" as in the comparative example, the number of the supply of the nitriding gas tends to increase until the thickness of the silicon nitride film reaches a design value. This makes it difficult to suppress the concentration of the nitrogen to a low level.

Under these circumstances, according to the first embodiment, the number of repetitions of the silicon film forming process (the sequence of steps S1 to S4) is increased to increase the thickness of the silicon film 4 (4-1, 4-2, . . . ,), thus increasing a content (or ratio) of silicon contained in the silicon nitride film 5. This allows a ratio of the nitrogen contained in the silicon nitride film 5 to be relatively suppressed. As a result, a selectable concentration range of the nitrogen can be expanded compared with the comparative example.

As described above, according to the first embodiment, it is possible to improve the control of the amount of concentration of the nitrogen contained in the silicon nitride film.

<For a Range of Film Formation Temperature>

Hereinafter, a range of film formation temperature will be described.

As described above with reference to FIG. 4, when forming the silicon film, a slight "fluctuation" occurs in the growth rate at a range of temperature of less than 400 degrees C. The reason for this is that, at the range of temperature of less than 400 degrees C., there are a range of temperature at which only adsorption occurs (or adsorption becomes dominant) and a range of temperature at which both adsorption and deposition occur (or a range of temperature at which the adsorption is transited to the CVD growth). At a temperature of 400 degrees C. or above, deposition starts to take place, that is, the silicon film begins an almost substantial CVD growth (the silicon can be deposited even with the $SiH_4$ gas alone).

As described above, when the silicon film begins the CVD-growth, a film formation rate is remarkably increased, while a step coverage may be degraded. Based on this, in the silicon nitride film forming method according to the first embodiment, the silicon film 4 (4-1, 4-2, . . . ) may be formed at a temperature less than a temperature at which the almost complete CVD growth starts to take place.

That is, in some embodiments, the film formation temperature of the silicon film 4 (4-1, 4-2, . . . ,) in step S1 may be set to a range of from a temperature at which the silicon initiates to be adsorbed onto the surface to be processed to less than a temperature at which the silicon initiates the CVD growth. An example of the temperature range may be a range of from 100 degrees C. to less than 400 degrees C. (in this range, adsorption or deposition of the silicon initiates with the $B_2H_6$ gas that reacts with the adsorbed $SiH_4$ gas).

In some embodiments, an example of the temperature range may be a range of more than the adsorption initiation temperature at which the silicon initiates to be adsorbed onto the surface to be processed to less than the CVD growth transition initiation temperature. At a range of temperature of from the CVD growth transition initiation temperature to less than the CVD growth initiation temperature, it is considered that both the adsorption and the slight CVD growth of the silicon coexist. The slight CVD growth of the silicon may cause that the surface of the silicon film 4 (4-1, 4-2, . . . ) has fine unevenness. To address this, in some embodiments, the film formation temperature of the silicon film 4 (4-1, 4-2, . . . ) in step S1 may be set to fall within a temperature range of from the adsorption initiation temperature to less than the CVD growth transition initiation temperature. Thus, the silicon film 4 (4-1, 4-2, . . . ) may be formed by the adsorption substantially. Examples of the temperature range may include a range of from 100 degrees C. to less than 300 degrees C.

<For Decomposition Accelerating Gas>

Next, the decomposition accelerating gas will be described.

As described above, lowering of the film formation temperature of the silicon film 4 (4-1, 4-2, . . . ) in step S1 to less than the CVD growth initiation temperature requires supplying the decomposition accelerating gas including a material for accelerating decomposition of the silicon source gas, as shown in step S3. Upon supplying the decomposition accelerating gas, the adsorbed $SiH_4$ and the decomposition accelerating gas (e.g., $B_2H_6$) react with each other so that the silicon is adsorbed or deposited. Accordingly, compared to the case where no decomposition accelerating gas is supplied, it is possible to generate the decomposition (e.g., thermal decomposition) of the silicon source gas at a relatively low temperature, thus adsorbing or depositing the silicon at a low temperature.

The effect of the thermal decomposition at the low temperature may differ depending on a material used in accelerating the thermal decomposition. In some embodiments, examples of the material may be the aforementioned boron. Therefore, a boron compound gas containing boron may be used as the decomposition accelerating gas.

Further, the effect of the thermal decomposition at the low temperature may differ depending on the boron compound gas. In the first embodiment, a boron-hydrogen-based compound gas (borane-based gas) and a boron-halogen-based compound gas ($BCl_3$ gas) are used as the boron compound gas.

In comparison with the borane-based gas and the boron-halogen-based gas, the borane-based gas has a greater effect in the thermal decomposition at the low temperature. For example, the use of the $B_2H_6$ gas as the borane-based gases enables the film formation temperature of the silicon film 4 (4-1, 4-2, . . . ) in step S1 to be lowered to 200 degrees C. or less. At a point of view of lowering the film forming temperature, the borane-based gas may be selected as the decomposition accelerating gas.

Further, it is considered that, in the related art, both the silicon source gas and the boron source gas are supplied into the processing chamber, but the related art does not describe any catalytic action by boron, or whether the catalytic action is weaker than that described in the first embodiment, if any. This is because that, upon simultaneously supplying the silicon source gas and the boron source gas into the processing chamber, the boron is difficult to adsorb onto the surface to be processed in a high density.

Also, it is considered that, in the related art, the boron source gas is supplied into the processing chamber. Similarly, the related art does not disclose the catalytic action by boron, or whether the catalytic action is weaker than that described in the first embodiment, if any. This is because the boron-containing silicon nitride film is further plasma-nitrided, thereby reducing a density of the boron to be formed onto the surface to be processed.

Based on these circumstances, it may be desirable that the decomposition accelerating gas is supplied before the supply of the silicon source gas or before the nitridation of the silicon film. Based on this, for example, step S1 and step S3 shown in FIG. 1 may be interchanged. Specifically, after the decomposition accelerating gas is supplied (step S3), the purging process is performed, followed by supplying the silicon source gas (step S1). Subsequently, the subsequent purging process is performed. In this way, step S1 and S3 may be interchanged.

<Silicon Film Nitriding Process>

Hereinafter, the silicon film nitriding process will be described.

In the first embodiment, when the silicon film 4 (4-1, 4-2, . . . ) is nitrided, the energy other than heat has been described to be applied to the nitriding gas. With this configuration, it is possible to nitride the silicon film 4 (4-1, 4-2, ...) at the low temperature, for example, at a temperature (e.g., 200 degrees C.) identical to the film formation temperature of the silicon film 4 (4-1, 4-2, ...). Specifically, in the first embodiment, active nitrogen (e.g., at least nitrogen radicals) is produced within the processing chamber by further applying the electrical energy (e.g., high-frequency power) to the nitriding gas. And then, the generated nitrogen radicals are allowed to react with the silicon film 4 (4-1, 4-2, ...) within the processing chamber to thereby nitride the silicon film 4 (4-1, 4-2, ...).

In this case, if the silicon source gas or the decomposition accelerating gas used in the above contains a halogen element, a small amount of the halogen element may remain in the silicon film 4 (4-1, 4-2, ...). In the first embodiment, chlorine atoms may remain. Even though the chlorine atoms remain in the silicon film 4 (4-1, 4-2, ...), it does not make any difference if the amount of chlorine atoms remained in the silicon film 4 is a little. However, in consideration of reducing the size of the silicon film 4 in the future, the small amount of chlorine atoms may have high possibility of affecting a film formation sequence of the silicon nitride film 5.

In particular, in the first embodiment, when the silicon film 4 (4-1, 4-2, ...) is nitrided, the electrical energy is further applied. When the electrical energy is applied to the small amount of chlorine atoms remaining in the silicon film 4 (4-1, 4-2, ...), the chlorine atoms may be separated from the silicon atoms or boron atoms, thereby causing a chlorine radical, a chlorine plasma, a chlorine ion, or the like within the processing chamber.

The chlorine radical, the chlorine plasma and the chlorine ion are etchants used for plasma etching the silicon. That is, when the silicon film 4 (4-1, 4-2, ...) is nitrided, a material used as the etchant is likely to be produced from the silicon film 4 (4-1, 4-2, ...). When the etchant that etches the silicon is produced within a reaction chamber, an etching reaction of taking the silicon atoms from the silicon film 4 (4-1, 4-2, ...) may simultaneously occur. An example of a reaction formula when the etchant is chlorine is as follows:

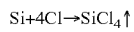

When the etching action as described above occurs simultaneously when the silicon film 4 (4-1, 4-2, ...) is nitrided, a thickness of the silicon film 4 (4-1, 4-2, ...) may be reduced or the surface roughness of the silicon film 4 (4-1, 4-2, ...) may be degraded. This may easily occur, especially when the energy other than heat is further applied when the silicon film 4 (4-1, 4-2, ...) is nitrided.

Thus, in the case in which the energy other than heat is further applied when the silicon film 4 (4-1, 4-2, ...) is nitrided, suppressing the etching action of the silicon film 4 (4-1, 4-2, ...) may require the following plan:

(a) Using a silicon compound gas containing no halogen elements as the silicon source gas, and (b) Using a compound gas containing no halogen elements as the decomposition accelerating gas.

At least one of the plans (a) and (b) may be employed. In some embodiments, both the plans (a) and (B) may be employed.

This plan suppresses the etching action from being occurred, when the silicon film 4 (4-1, 4-2, ...) is nitrided, which can control the film thickness better and prevent degradation in the surface roughness.

In some embodiments, the following plans may be employed:

(c) Using a silane-based gas as the silicon source gas, and (d) Using a borane-based gas used as the decomposition accelerating gas.

Employing both the plans (c) and (d) may realize both the plans (a) and (b). In addition, the silicon film may be implemented by only three elements of silicon, hydrogen and boron, in fact.

Hydrogen is an element playing a key role in forming an amorphous silicon film. Also, when boron is contained at a rate of less than 1% in a silicon nitride film to be formed, the formed silicon nitride film, in fact, may be handled as a silicon nitride film (SiN). Conversely, when the boron is contained in the formed silicon nitride film at a rate of more than 1%, the formed silicon nitride film may be handled as a boron-containing silicon nitride film (SiBN). Such a boron is an element that does not do any harm even when existing in the silicon nitride film, and acts as an essential element in the formation of the SiBN film.

As described above, by simultaneously employing both the plans (c) and (d), it is possible to prevent an unnecessary element from remaining or being mixed in the formed silicon nitride film, thus forming a silicon nitride film of a better quality.

<Method of Selectively Producing SiN Film and SiBN Film>

Next, a method of selectively produced an SiN film and an SiBN film will be described.

The use of the boron compound gas as the decomposition accelerating gas enables the boron to be contained in the formed silicon nitride film 5. The silicon nitride film 5 may be produced as any one of the SiN film and the SiBN film by controlling the content of boron.

In a specific example, when the content of boron contained in the formed silicon nitride film 5 is less than 1%, the formed silicon nitride film 5, in fact, may be handled as the silicon nitride film (SiN).

Also, when the content of boron contained in the formed silicon nitride film 5 is equal to or greater than 1%, the formed silicon nitride film 5 may be regarded as the boron-containing silicon nitride film (SiBN).

In this manner, the SiN film and the SiBN film can be selectively produced by using the boron compound gas as the decomposition accelerating gas and controlling the content of boron in the formed silicon nitride film 5, which makes it possible to realize a high utilization of the film forming process.

<Film Formation Temperature and Nitridation Temperature of Silicon Film>

Hereinafter, a film formation temperature and a nitridation temperature of the silicon film 4 (4-1, 4-2, ...) will be described.

By using the decomposition accelerating gas in the formation of the silicon film 4 (4-1, 4-2, ...) and also applying the energy other than heat to the nitriding gas in the nitridation of the silicon film 4 (4-1, 4-2, ...), it is possible to lower both the film formation temperature and the nitridation temperature to a low temperature of, e.g., less than 400 degrees C.

This configuration enables the film formation temperature and the nitridation temperature of the silicon film 4 (4-1, 4-2, ...) to be equal to each other. Thus, there is no need for changing an internal temperature of the processing chamber in the transition of the forming process of the silicon film (step S1 to step S4) to the nitriding process of the silicon film (step S6 and step S7).

The change of the internal temperature of the processing chamber causes a waiting time such as a period of heating-up time and a period of heating-down time during which the film forming process for a target object pauses.

Such a waiting time may be reduced by making the film formation temperature and the nitridation temperature of the silicon film 4 (4-1, 4-2, ...) to be identical. The reduction of the waiting time further enhances productivity of the silicon nitride film forming method according to the first embodiment.

Second Embodiment

In the silicon nitride film forming method according to the first embodiment, step S1 and step S3 have been described to be interchanged. The second embodiment is a specific example in which step S1 and step S3 are interchanged.

FIG. 7 is a flowchart showing an example of a silicon nitride film forming method according to the second embodiment of the present disclosure.

As shown in FIG. 7, in the second embodiment, the silicon substrate 1 is carried into the processing chamber of the film forming apparatus, and subsequently, the decomposition accelerating gas as described above is supplied toward the surface to be processed of the silicon substrate 1 inside the processing chamber (step S3). The processing conditions in step S3 may be identical to those in step S3 described in the first embodiment.

Subsequently, for example, an inert gas is supplied into the processing chamber while exhausting the processing chamber such that the interior of the processing chamber is purged (step S2). The inert gas used in step S2 may be similar to that described in the first embodiment.

Thereafter, the silicon source gas containing silicon is supplied toward the surface to be processed of the silicon substrate 1 (step S1). The processing conditions in step S4 may be similar to those of step S1 described in the first embodiment.

Subsequently, for example, an inert gas is supplied into the processing chamber while exhausting the processing chamber such that the interior of the processing chamber is purged (step S4). The inert gas used in step 4 may be similar to that described in the first embodiment.

Subsequently, as shown in step S5 of FIG. 7, it is determined whether the number of repetitions of the sequence of steps S3-S2-S1-S4 which is defined as the silicon film forming process has reached the predetermined set value n (where n is 1 or greater). If the result of the determination is NO, the sequence of steps S3-S2-S1-S4 is resumed. If the result of the determination is YES, the process proceeds to step S6 as in the first embodiment. Subsequently, the sequence of steps S6 and S7 as the silicon film nitriding process is performed p number of times as the predetermined set value (where p is 1 or greater). Thereafter, as shown in step S9, it is determined that the number of a sequence in which the silicon film forming process and the silicon film nitriding process are defined as one cycle has reached the predetermined set value m (where m is 1 or greater). If the result of the determination is NO, the sequence is resumed. If the result of the determination is YES, the process of the silicon nitride film forming method according to the second embodiment is terminated.

As described above, the supply of the silicon source gas (step S1) and the supply of the decomposition accelerating gas (step S3) may be interchanged such that the decomposition accelerating gas is first supplied (step S3), followed by supplying the silicon source gas (step S1).

In the first embodiment, the predetermined set value n in step S5 is set to be 2 or greater, while in the second embodiment, the decomposition accelerating gas is supplied to the surface to be processed of the silicon substrate 1 prior to the supply of the silicon source gas so that the predetermined set value n in step S5 is set to be 1 or greater. This improves throughput and reduces the use of the silicon source gas and the decomposition accelerating gas. Further, according to the silicon nitride film forming method according to the second embodiment, it is possible to increase a degree of freedom of the film forming process.

<Film Forming Apparatus>

Hereinafter, a film forming apparatus according to a third embodiments of the present disclosure, which is capable of implementing the silicon nitride film forming method according to the first and second embodiments of the present disclosure, will be described.

Figure 8:
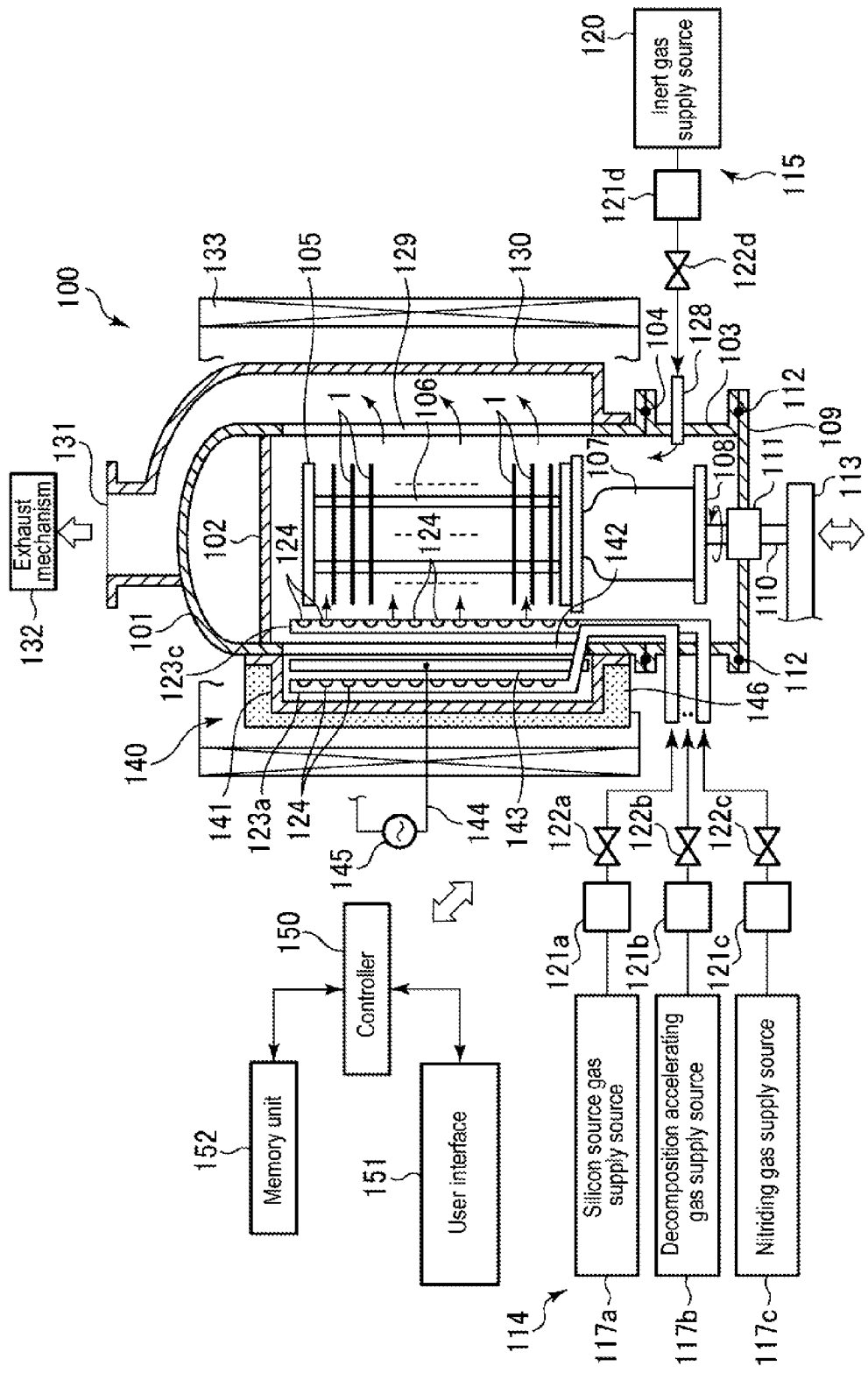
FIG. 8 is a vertical cross-sectional view schematically showing a film forming apparatus according to a third embodiment of the present disclosure, which is capable of performing the silicon nitride film forming methods according to the first and second embodiments.
Figure 9:
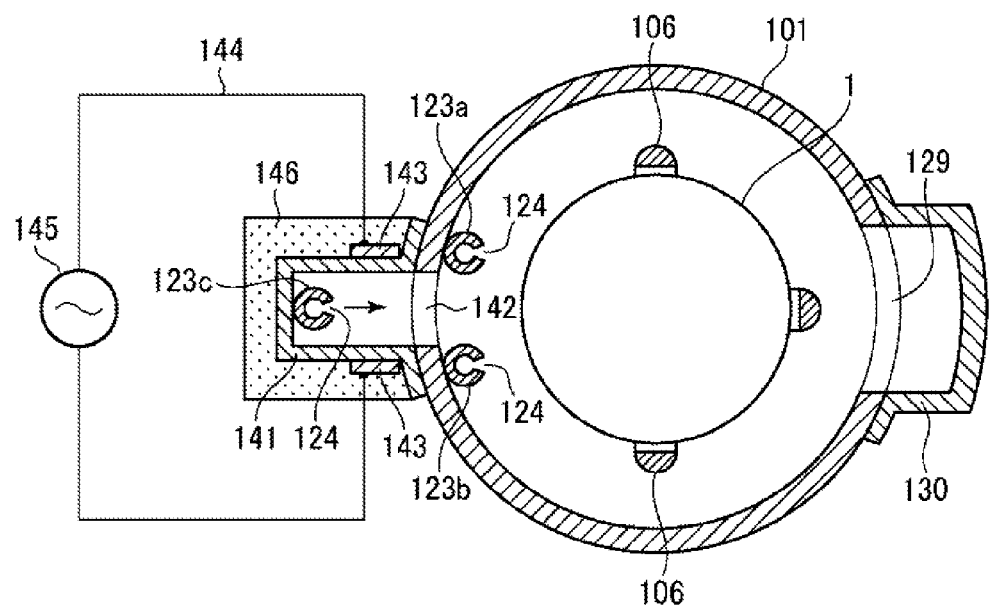
FIG. 9 is a horizontal cross-sectional view of the film forming apparatus of FIG. 8.

FIG. 8 is a vertical cross-sectional view schematically showing a film forming apparatus 100 according to a third embodiments of the present disclosure, which is capable of implementing the silicon nitride film forming method according to the first and second embodiments of the present disclosure, and FIG. 9 is a horizontal cross-sectional view of the film forming apparatus 100 of FIG. 8 when viewed from the top.

As shown in FIGS. 8 and 9, the film forming apparatus 100 includes a cylindrical processing chamber 101 having a ceiling with a lower end opened. The entirety of the processing chamber 101 is formed of, e.g., quartz. A quartz ceiling plate 102 is installed at the ceiling inside the processing chamber 101. A cylindrical manifold 103 formed of, e.g., stainless steel, is connected to a lower end opening portion of the processing chamber 101 through a sealing member 104 such as an O-ring.

The manifold 103 supports a lower end portion of the processing chamber 101. A vertical wafer boat 105 is inserted into the processing chamber 101 through a lower portion of the manifold 103. The vertical wafer boat 105 includes a plurality of rods 106 having a plurality of support recesses (not shown) formed therein. A plurality of (e.g., 50 to 100) semiconductor substrates (in this example, the silicon substrates 1) as target objects is supported by the support recesses. In this example, portions of respective peripheries of the silicon substrates 1 are supported by the support recesses. With this configuration, in the vertical wafer boat 105, the silicon substrates 1 are loaded in multiple-stages. Thus, the plurality of silicon substrates 1 is accommodated in the processing chamber 101 in a height direction.

The vertical wafer boat 105 is mounted on a table 108 through a quartz heat insulation tube 107. The table 108 is supported on a rotary shaft 110 that pierces a cover 109 that is formed of, e.g., a stainless steel, to open/close a bottom opening of the manifold 103. For example, a magnetic fluid seal 111 is installed at a piercing portion of the rotary shaft 110 to seal the rotary shaft 110 tightly and support the rotary shaft 110 rotatably. A seal member 112 formed of, for example, an O ring, is installed between a peripheral portion of the cover 109 and a bottom end of the manifold 103. Accordingly, the sealing state in the processing chamber 101 is maintained. The rotary shaft 110 is installed at a front end of an arm 113 supported by an elevating mechanism (not shown) such as a boat elevator. Thus, the vertical wafer boat 105, the cover 109 and the like are elevated in an integrated manner to be inserted into/separated from the processing chamber 101.

The film forming apparatus 100 includes a process gas supply mechanism 114 configured to supply a process gas into the processing chamber 101, and an inert gas supply mechanism 115 configured to supply an inert gas into the processing chamber 101.

In this example, the process gas supply mechanism 114 includes a silicon source gas supply source 117a, a decomposition accelerating gas supply source 117b, and a nitriding gas supply source 117c. The inert gas supply mechanism 115 includes an inert gas supply source 120.

A silicon source gas supplied from the silicon source gas supply source 117a is used in step S1 shown in FIG. 1. An example of silicon source gas may be an $SiH_4$ gas. A decomposition accelerating gas supplied from the decomposition accelerating gas supply source 117b is used in step S3 shown in FIG. 1. An example of the decomposition accelerating gas may be a $B_2H_6$ gas. A nitriding gas supplied from the nitriding gas supply source 117c is used in step S6 shown in FIG. 1. An example of the nitriding gas may be an $NH_3$ gas. An inert gas supplied from the inert gas supply source 120 is used to dilute the gases supplied into the processing chamber 101 or perform the purging process in steps S2, S4 and S7 shown in FIG. 1. An example of the inert gas may be an Ar gas.

The silicon source gas supply source 117a is coupled to a dispersion nozzle 123a through a flow rate controller 121a and an on-off valve 122a. The decomposition accelerating gas supply source 117b is coupled to a dispersion nozzle 123b (not shown in FIG. 8, and see FIG. 9) through a flow rate controller 121b and an on-off valve 122b. The nitriding gas supply source 117c is coupled to a dispersion nozzle 123c through a flow rate controller 121c and an on-off valve 122c.

Each of the dispersion nozzles 123a to 123c includes a quartz pipe, pierces a side wall of the manifold 103 inward, bends upward, and extends vertically. At a vertical portion of each of the dispersion nozzles 123a to 123c, a plurality of gas discharge holes 124 is formed spaced apart from one another by a predetermined distance. Thus, each gas is approximately uniformly discharged from the respective gas discharge holes 124 into the processing chamber 101 in a horizontal direction.

A plasma generation mechanism 140 is formed in a portion of a side wall of the processing chamber 101. The plasma generation mechanism 140 is used as an energy application mechanism configured to apply energy to the nitriding gas so as to generate at least active nitrogen. The plasma generation mechanism 140 includes a plasma partition wall 141 which is tightly welded to an outer wall of the processing chamber 101. The plasma partition wall 141 is formed of, for example, quartz. The plasma partition wall 141 has a concave cross section shape to cover an opening 142 formed in the side wall of the processing chamber 101. The opening 142 has an elongated shape formed by chipping the side wall of the processing chamber 101 in a vertical direction such that all of the silicon substrates 1 supported by the vertical wafer boat 105 in the vertical direction are covered. In this example, the dispersion nozzle 123c configured to discharge the nitriding gas is disposed in an inner space defined by the plasma partition wall 141, i.e., in a plasma generation space.

The plasma generation mechanism 140 includes a pair of elongated plasma electrodes 143 and a high-frequency power source 145 connected to each of the plasma electrodes 143 through a power feed line 144. The pair of elongated plasma electrodes 143 is disposed to vertically face each other on outer surfaces of both side walls of the plasma partition wall 141. The high-frequency power source 145 supplies a high-frequency power to the pair of plasma electrodes 143 through the power feed line 144. The high-frequency power source 145 applies a high-frequency voltage of, e.g., 13.56 MHz, to the pair of plasma electrodes 143. Thus, a high-frequency electric field is applied in the plasma generation space defined by the plasma partition wall 141. The nitriding gas discharged from the dispersion nozzle 123c is converted to plasma within the plasma generation space to which the high-frequency electric field is applied. The converted plasma is supplied into the processing chamber 101 as a plasma gas containing, e.g., an active nitrogen such as a nitrogen radical (N*) or an ammonia radical (NH*), through the opening 142. Further, in the film forming apparatus 100, when supplying the high-frequency power to the pair of plasma electrodes 143 is stopped, the nitriding gas discharged from the dispersion nozzle 123c, without being converted to plasma, may be supplied into the processing chamber 101.

At an outer side of the plasma partition wall 141, an insulation protection cover 146 made of, e.g., quartz, is installed to cover the plasma partition wall 141. A coolant flow path (not shown) is formed at an inner portion of the insulation protection cover 146 such that the plasma electrodes 143 can be cooled by a cooled nitrogen gas flowing through the coolant flow path.

The inert gas supply source 120 is coupled to a nozzle 128 through a flow rate controller 121d and an on-off valve 122d. The nozzle 128 penetrates through the side wall of the manifold 103 to discharge the inert gas from a front end thereof in the horizontal direction.

At a portion opposite to the dispersion nozzles 123a to 123c in the processing chamber 101, an exhaust vent 129 is formed to exhaust the processing chamber 101. The exhaust vent 129 has an elongated shape formed by vertically chipping the side wall of the processing chamber 101. At a portion corresponding to the exhaust vent 129 of the processing chamber 101, an exhaust vent cover member 130 with a C-shaped section is installed by welding to cover the exhaust vent 129. The exhaust vent cover member 130 extends upward along the side wall of the processing chamber 101, and defines a gas outlet 131 at the top of the processing chamber 101. An exhaust mechanism 132 including a vacuum pump, or the like is connected to the gas outlet 131. The exhaust mechanism 132 exhausts the processing chamber 101 to discharge the process gas and to change an internal pressure of the processing chamber 101 into a process pressure.

A cylindrical body-shaped heating device 133 is installed on the outer periphery of the processing chamber 101. The heating device 133 activates a gas supplied into the processing chamber 101, and heats the target object (the silicon substrates 1 in this example) accommodated within the processing chamber 101.

For example, the components of the film forming apparatus 100 are controlled by a controller 150 including a microprocessor (e.g., a computer). The controller 150 is connected to a user interface 151 including a keyboard for inputting, by an operator, a command to control the film forming apparatus 100, and a display unit for displaying an operation state of the film forming apparatus 100.

A memory unit 152 is connected to the controller 150. The memory unit 152 stores a control program for executing various processes in the film-forming apparatus 100 under the control of the controller 150, and a program (i.e., a recipe) for executing a process in each component of the film-forming apparatus 100 according to the process conditions. For example, the recipe is stored in a memory medium of the memory unit 152. The memory medium may include a hard disk, a semiconductor memory, a CD-ROM, a DVD, and a portable memory such as a flash memory. The recipe may be suitably transmitted from other devices through a dedicated line. If necessary, the recipe is read from the memory unit 152 in response to a command received from the user interface 151, and the controller 150 executes a process according to the read recipe. Accordingly, the film-forming apparatus 100 performs a desired process under the control of the controller 150.

The silicon nitride film forming method according to the first and second embodiments of the present disclosure is performed using the film forming apparatus 100 as shown in FIGS. 8 and 9, which includes the controller 150 configured to control the silicon source gas supply source 117a, the decomposition accelerating gas supply source 117b, the nitriding gas supply source 117c, the heating device 133, and the plasma generation mechanism 140.

<Film Forming Apparatus: Second Example>

Figure 10:
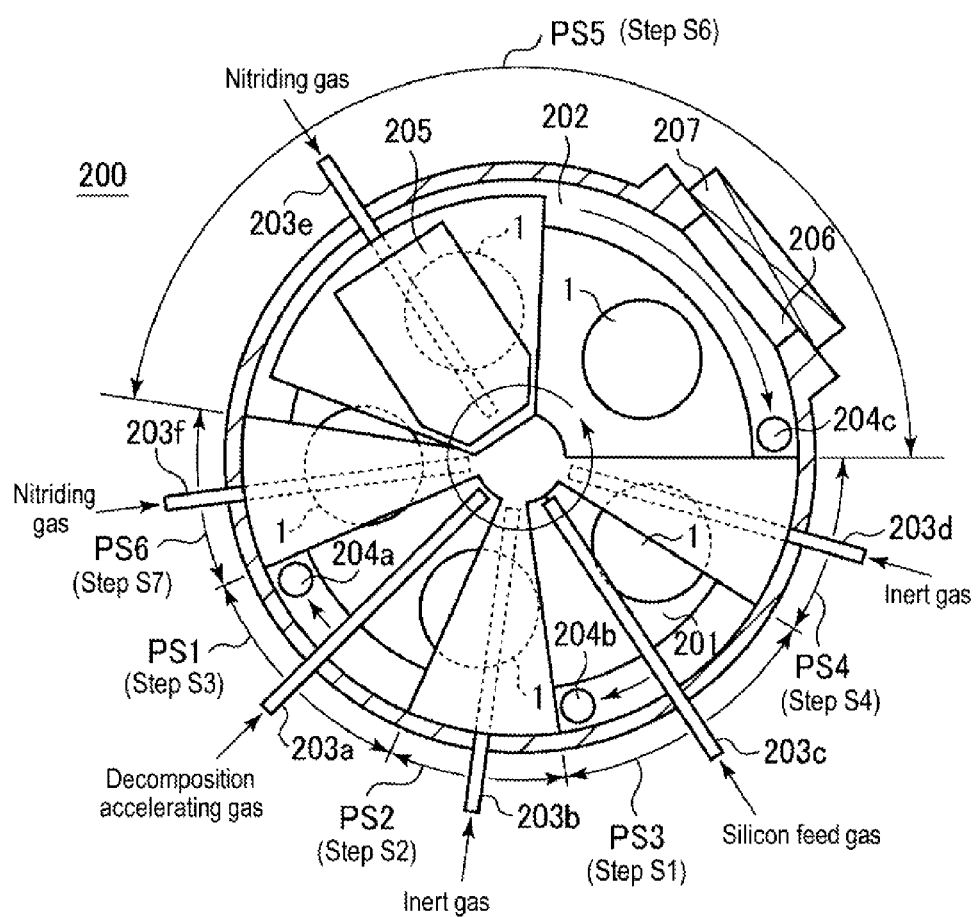
FIG. 10 is a horizontal cross-sectional view schematically showing a film forming apparatus according to a fourth embodiment of the present disclosure, which is capable of performing the silicon nitride film forming methods according to the first and second embodiments.

FIG. 10 is a horizontal cross-sectional view schematically showing a second example of a film forming apparatus capable of performing the silicon nitride film forming method according to the first and second embodiments of the present disclosure.

The film forming apparatus is not limited to the batch-type vertical film forming apparatus as shown in FIGS. 8 and 9. In some embodiments, a horizontal batch-type film forming apparatus 200 as shown in FIG. 10 may be used as the film forming apparatus. In FIG. 10, a horizontal cross-section of a processing chamber 202 of the horizontal batch-type film forming apparatus 200 is schematically shown. Further, in FIG. 10, a process gas supply mechanism, an inert gas supply mechanism, an exhaust device, a heating device, a controller, and the like is omitted. Also, the film forming apparatus 200 of the second example may be effectively used, especially for the silicon nitride film forming method according to the second embodiment. Thus, the film forming apparatus 200 of the second example will be described based on the assumption that it is applied to the silicon nitride film forming method according to the second embodiment.

As shown in FIG. 10, the film forming apparatus 200 performs a film forming process on a plurality of (e.g., 5) silicon substrates 1 which is mounted on a turntable 201 in a circumferential direction. The turntable 201 is installed within the processing chamber 202 of the film forming apparatus 200. The turntable 201 rotates in a counterclockwise direction, for example.

The interior of the processing chamber 202 is divided into six processing stages PS1 to PS6. Once the turntable 201 rotates, the silicon substrates 1 go the circuit of the six processing stages. In this example, once the turntable 201 rotates once, one cycle including the silicon film forming process and the silicon film nitriding process is carried out. Specifically, the five silicon substrates 1 are mounted on the turntable 201, and subsequently, a decomposition accelerating gas (e.g., diborane gas) is first supplied as a catalyst of the accelerating decomposition into the processing chamber 202 such that the diborane gas is adsorbed onto each of the silicon substrates 1. Thereafter, a silicon source gas is supplied into the processing chamber 202 such that a silicon film is formed on each of the silicon substrates 1. And then, plasma is ignited to nitride the silicon films. Under these circumstances, the gas is continuously supplied during a predetermined cycle while rotating the turntable 201.

The first processing stage PS1 corresponds to step S3 shown in FIG. 7. In the processing stage PS1, the decomposition accelerating gas is supplied toward a surface to be processed of each of the silicon substrates 1. A gas supply pipe 203a through which the decomposition accelerating gas is supplied, is disposed at an upper side of the first processing stage PS1. The decomposition accelerating gas supplied from the gas supply pipe 203a is applied toward the surfaces to be processed of the respective silicon substrates 1 which are exposed in the first processing stage PS1 while being mounted on the turntable 201. At a portion corresponding to the first processing stage PS1 in the processing chamber 202, an exhaust vent 204a is formed to discharge the decomposition accelerating gas. In this example, a direction of discharging the gas is the opposite direction in which the turntable 201 is rotated. An example of the decomposition accelerating gas may include a gas containing $B_2H_6$ of 0.1% An example of processing conditions in the first processing stage PS1 may be that a flow rate of the gas containing $B_2H_6$ of 0.1% is 250 sccm and a processing pressure is 133 Pa (1 Torr).

A processing stage adjacent to the processing stage PS1 in the counterclockwise direction is the second processing stage PS2 in which step S2 shown in FIG. 7 is performed. The second processing stage PS2 has a relatively narrow space. The silicon substrate 1 is exposed in the narrow space while being mounted on the turntable 201. A gas supply pipe 203b is installed to supply an inert gas into the narrow space where a purging process is performed. The narrow space may serve as a gas separation area where different process gases are separated. An example of the inert gas may be a nitrogen gas. The nitrogen gas is supplied at a flow rate of, e.g., 1000 sccm.

A processing stage adjacent to the second processing stage PS2 in the counterclockwise direction is the third processing stage PS3 in which step S1 shown in FIG. 7 is performed. In the third processing stage PS3, a silicon source gas is supplied toward the surface to be processed of each of the silicon substrates 1. A gas supply pipe 203c through which the silicon source gas is supplied, is disposed at an upper side of the third processing stage PS3. The silicon source gas supplied from the gas supply pipe 203c is applied toward the surface to be processed of each of the silicon substrates 1 which is exposed in the third processing stage PS3 while being mounted on the turntable 201. At a portion near the second processing stage PS2 in the third processing stage PS3 of the processing chamber 202, an exhaust vent 204b through which the silicon source gas is discharged. An example of the silicon source gas may be a $Si_2H_6$ gas. An example of processing conditions in the third processing stage PS3 may be that a flow rate of the $Si_2H_6$ gas is 200 sccm and an processing pressure is 133 Pa (1 Torr).

A processing stage adjacent to the third processing stage PS3 in the counterclockwise direction is the fourth processing stage PS4 where step S4 shown in FIG. 7 is performed. The fourth processing stage PS4 has a relatively narrow space like the second processing stage PS2 and also serves as the gas separation area. A gas supply pipe 203d is installed to supply an inert gas into the narrow space where the silicon substrates 1 are subjected to the purging process. An example of the inert gas may be a nitrogen gas. The nitrogen gas is supplied at a flow rate of, e.g., 1000 sccm.

A processing stage adjacent to the fourth processing stage PS4 in the counterclockwise direction is the fifth processing stage PS5 where step S6 shown in FIG. 7 is performed. In the fifth processing stage PS5, a nitriding gas is supplied toward the surface to be processed of the silicon substrate 1 and the supplied nitriding gas is changed to plasma. To do this, a gas supply pipe 203e through which the nitriding gas is supplied and a plasma generation mechanism 205 is disposed at an upper side of the fifth processing stage PS5. The nitriding gas supplied from the gas supply pipe 203e is applied toward the surface to be processed of the silicon substrate 1 which is exposed in the fifth processing stage PS5 while being mounted on the turntable 201. The plasma generation mechanism 205 applies energy to the nitriding gas to generate at least active nitrogen. At a portion close to the fourth processing stage PS4 in the processing stage PS5 of the processing chamber 202, an exhaust vent 204c is formed to discharge the nitriding gas. An example of the nitriding gas may be a nitrogen gas. In the ignition of the plasma, the nitrogen gas is supplied at a flow rate of 200 sccm and an argon gas is supplied at a flow rate of 4500 sccm. After the ignition, the supply flow rate of the nitrogen gas is changed to 5000 sccm.

Further, the fifth processing stage PS5 also serves as a loading/unloading stage in which the silicon substrate 1 is loaded into the processing chamber 202 or unloaded from the processing chamber 202. The silicon substrate 1 is loaded into or unloaded from the processing chamber 202 through a wafer loading/unloading port 206. The loading/unloading port 206 is opened and closed by a gate valve 207.

A processing stage adjacent to the fifth processing stage PS5 in the counterclockwise direction is the sixth processing stage PS6 where step S7 shown in FIG. 7 is performed. The sixth processing stage PS6 has a relatively narrow space like the second and fourth processing stages PS2 and PS4 and also serves as the gas separation area. An inert gas is supplied into the narrow space through a gas supply pipe 203f such that the silicon substrate 1 exposed to the narrow space is subjected to the purging process.

A processing stage adjacent to the sixth processing stage PS6 in the counterclockwise direction is the first processing stage PS1 as described above. Thus, after the turntable 201 rotates once, the silicon substrates 1 mounted on the turntable 201 are subjected to the processes related to the sequence of steps S3→S2→S1→S4→S6→S7→S3, . . . as shown in FIG. 7. The exhaust vent 204a of the first processing stage PS1 is installed at a portion close to the sixth processing stage PS6 in the first processing stage PS1 of the processing chamber 202.

In the film forming apparatus 200 configured as above, upon one rotation of the silicon substrate 1, the one cycle including the silicon film forming process and the silicon film nitridation process as shown in FIG. 7 is completed. In the film forming apparatus 200, the turntable 201 rotates the m number of times as the predetermined set value with the silicon substrates 1 mounted thereon, thus forming the silicon nitride film on the surface to be processed of each of the silicon substrates 1.

Figure 11:
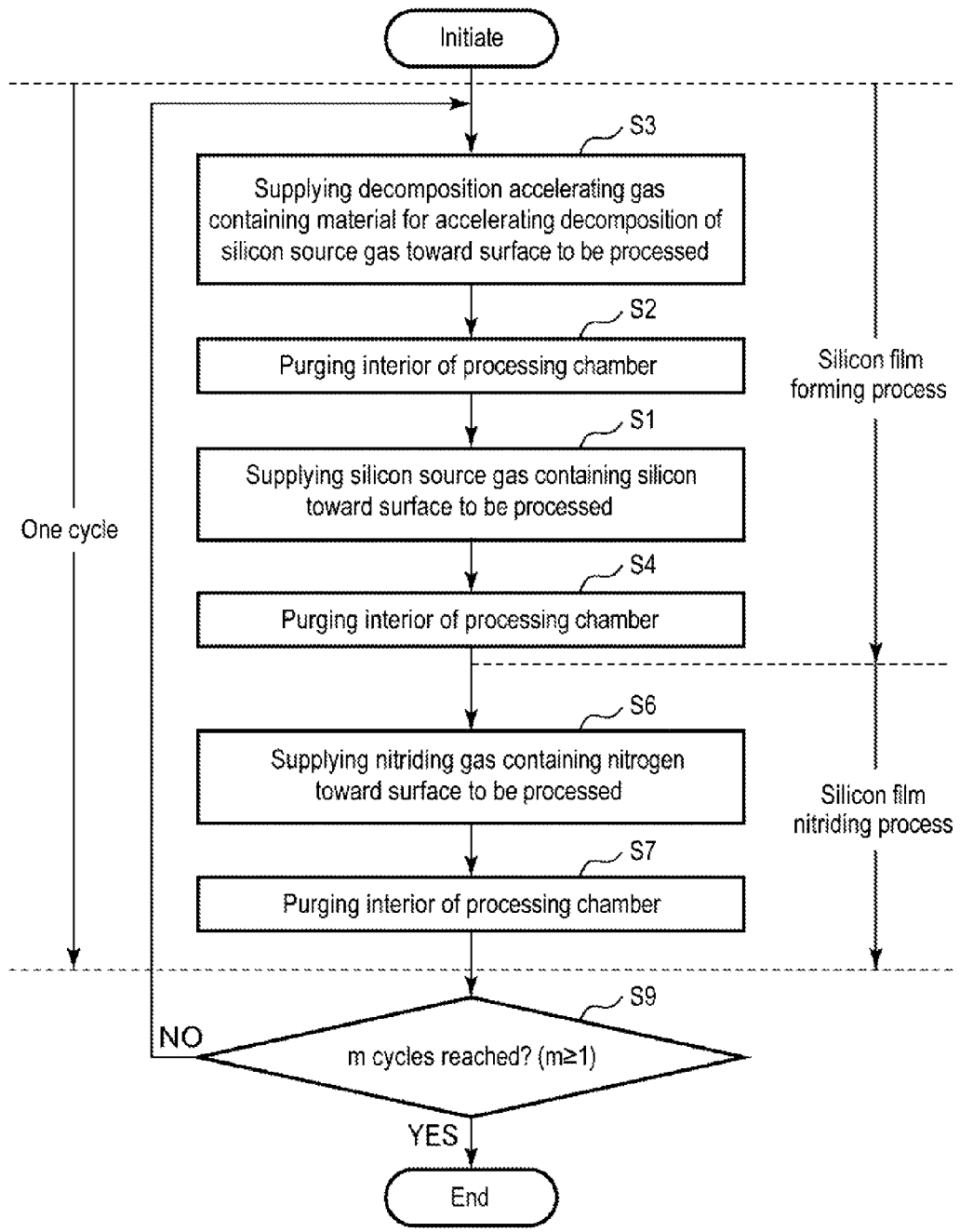
FIG. 11 is a flowchart showing a sequence when the silicon nitride film forming method is performed using the film forming apparatus according to the fourth embodiment.

Further, in the film forming apparatus 200 shown in FIG. 10, the predetermined set value n in the silicon film forming process (the sequence of steps S3→S2→S1→S4) is "1" and similarly, the predetermined set value p in the silicon film nitridation process (the sequence of steps S6→S7) is "1". As a result, strictly speaking, as shown in FIG. 11, the film forming apparatus 200 is operated to exclude the determination processes of both steps S5 and S8 from the sequence shown in FIG. 7. That is, in the silicon nitride film forming method according to the second embodiment, for "n=1" and "p=1", whether the silicon film forming process has been performed by the predetermined set value n (step S5) and whether the silicon film nitridation process has been performed by the predetermined set value p (step S8) may be omitted.

Accordingly, it is possible to perform the silicon nitride film forming method according to the first and second embodiments of the present disclosure using the horizontal batch-type film forming apparatus 200 shown in FIG. 10.
<Dependency of Temperature on Film Thickness in Horizontal Batch-Type Film Forming Apparatus 200>

Hereinafter, the dependency of temperature on a thickness of the silicon nitride film formed using the horizontal batch-type film forming apparatus 200 will be described.

Figure 12:
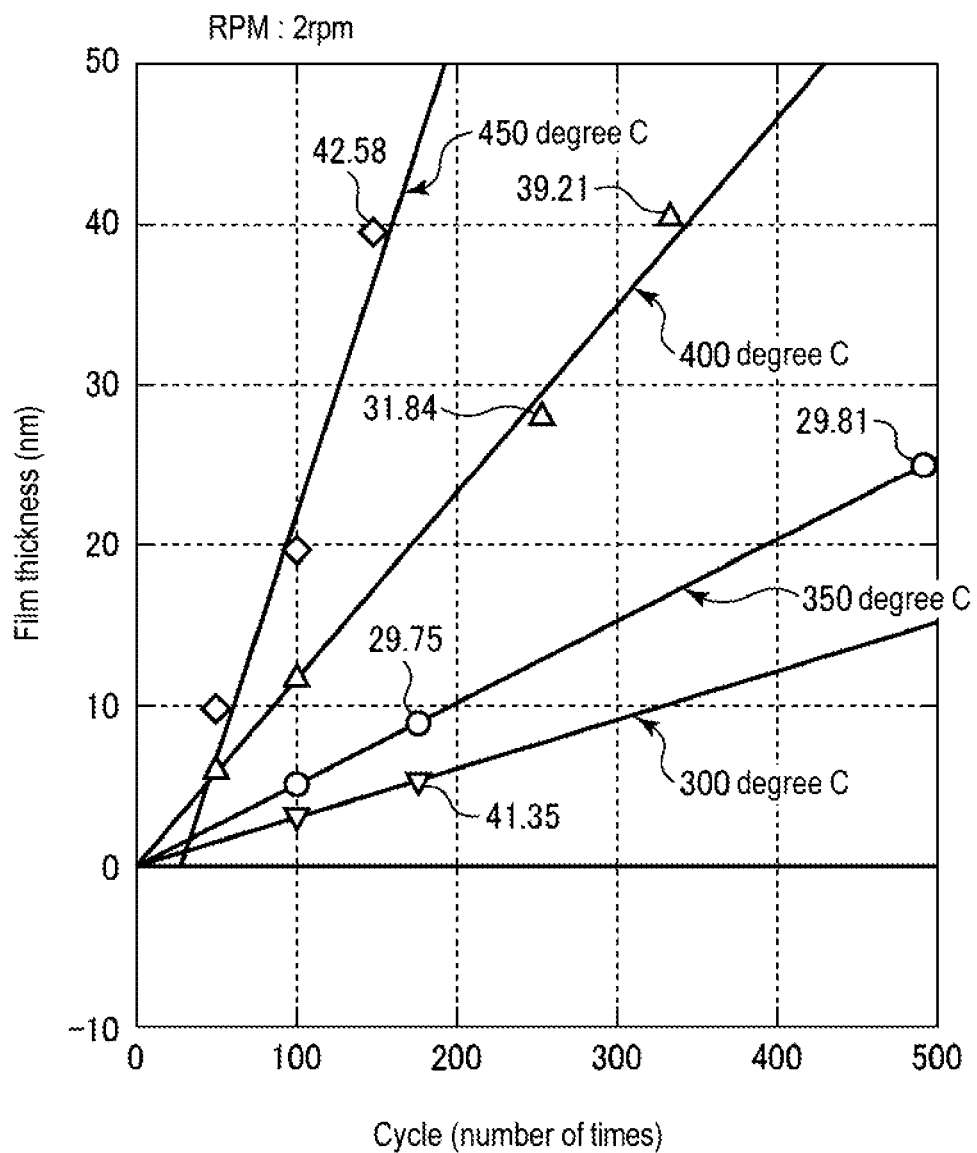
FIG. 12 is a view showing a relationship between the number of cycle and a thickness of a silicon nitride film at every processing temperature.

FIG. 12 is a view showing a relationship between the number of cycles and thicknesses of the silicon nitride film at every processing temperature. Further, the decomposition accelerating gas used in the first processing stage PS1 (step S3) is a diborane gas, the silicon source gas used in the third processing stage PS3 (step S1) is a monosilane gas, and the nitriding gas used in the fifth processing stage PS5 (step S6) is an ammonia gas. Also, the number of revolutions of the turntable 201 was set to 2 rpm.

As shown in FIG. 12, in the film forming apparatus 200, a processing temperature was changed to 450 degrees C., 400 degrees C., 350 degrees C., and 300 degrees C. As a result, it was confirmed that the silicon nitride film is formed even at the processing temperature of 300 degrees C. A film formation rate was increased as the processing temperature increases, and thus, a silicon nitride film having a greater thickness was formed at a smaller number of cycles.

As an example, in order to form a silicon nitride film having a thickness of about 40 nm, about 150 cycles was required at the processing temperature of 450 degrees C. and about 350 cycles was required at the processing temperature of 400 degrees C. In order to form a silicon nitride film having a thickness of about 20 nm, about 100 cycles was required at the processing temperature of 450 degrees C., about 160 cycles was required at the processing temperature of about 400 degrees C., and about 400 cycles was required at the processing temperature of about 350 degrees C. Also, in order to form a silicon nitride film having a thickness of about 10 nm, about 50 cycles was required at the processing temperature of 450 degrees C., about 90 cycles was required at the processing temperature of about 400 degrees C., about 200 cycles was required at the processing temperature of about 350 degrees C., and about 330 cycles was required at the processing temperature of about 300 degrees C.

As can be seen from the results, the formation of the silicon nitride film having a great thickness with better throughput requires selecting a high processing temperature, for example, ranging from 400 degrees C. to 450 degrees C. In addition, the formation of the silicon nitride film having a small thickness requires selecting a processing temperature ranging from 300 degrees C. to 400 degrees C.

Further, in FIG. 12, in-plane uniformity of the thickness of the formed silicon nitride film is indicated by numbers. For the processing temperature of 450 degrees C. and the film thickness of about 40 nm, the in-plane uniformity was 42.58 (±%). For the processing temperature of 400 degrees C. and the film thickness of about 40 nm, the in-plane uniformity was 39.21 (±%). However, for the processing temperature of 400 degrees C. and a film thickness of about 28 nm, the in-plane uniformity was 31.84 (±%), thus obtaining a relatively good result.

Also, for the processing temperature of 350 degrees C., the in-plane uniformity was 29.81 (±%) when a film thickness is about 25 nm, and the in-plane uniformity was 29.75 (±%) when the film thickness is about 9 nm, thus obtaining good results of less than 30 (±%). Also, for the processing temperature of 300 degrees C., the in-plane uniformity was 41.35 (±%) when a film thickness is about 5 nm.

As can be seen from the above results, in order to obtain the in-plane uniformity of about 30 (±%) or lower in the thickness of the silicon nitride film, the processing temperature may be fallen within a range of 300 degrees C. to 400 degrees C.
<Film Quality of Silicon Nitride Film in Film Forming Apparatus 200>

Hereinafter, a film quality of the silicon nitride film formed using the horizontal batch-type film forming apparatus 200 will be described.

Figure 13:
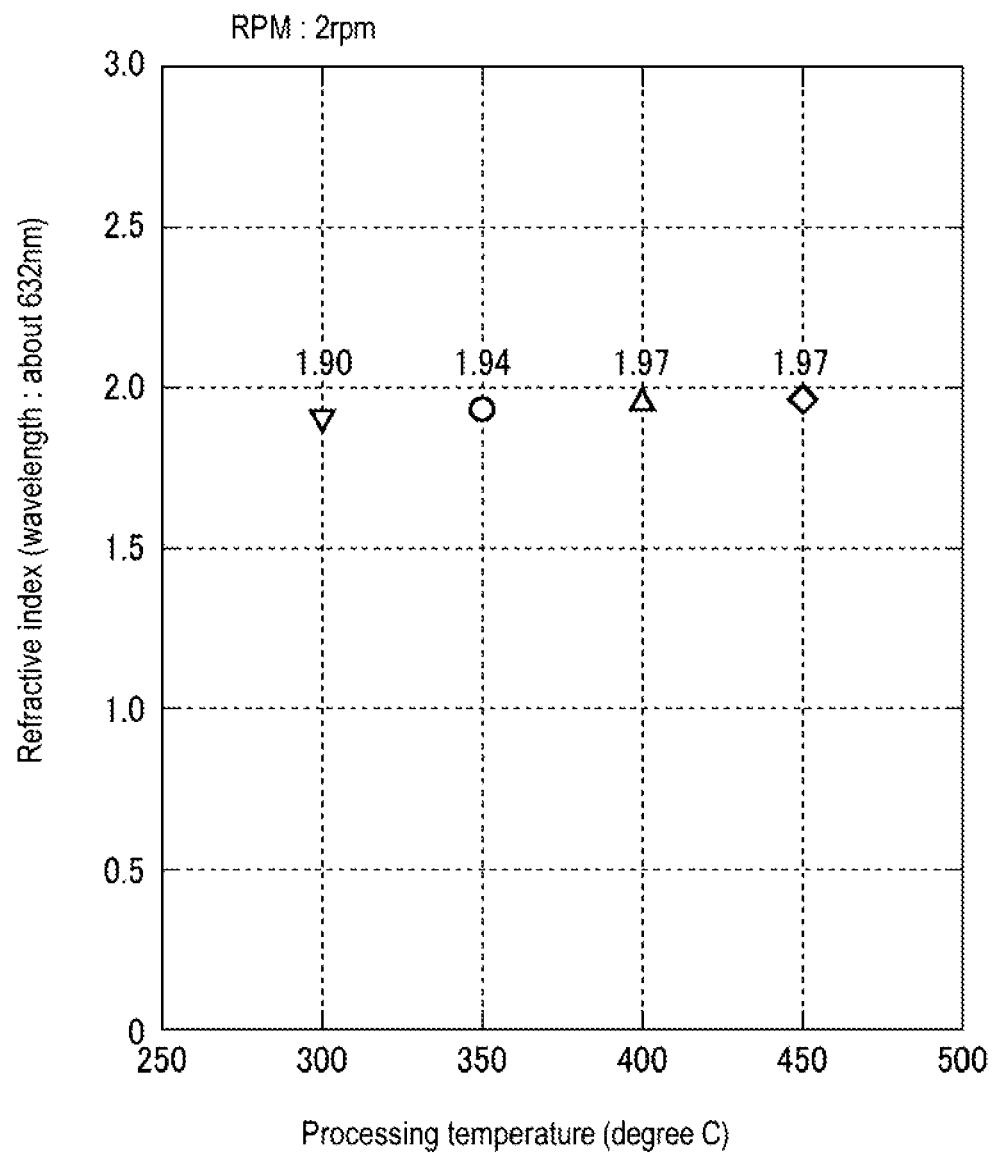
FIG. 13 is a view showing a relationship between a processing temperature and a refractive index of a silicon nitride film.

FIG. 13 is a view showing a relationship between a processing temperature and a refractive index of the silicon nitride film. The refractive index when a wavelength of light is about 632 nm is represented.

As shown in FIG. 13, the refractive index of the formed silicon nitride film ranges from 1.90 to 1.97 at a range of the processing temperature of 300 degrees C. to 450 degrees C. This relationship shown that the silicon nitride film formed using the horizontal batch-type film forming apparatus 200 has good film quality.

As described above, the silicon nitride film forming method according to the above embodiments of the present disclosure can be sufficiently performed even by using the horizontal batch-type film forming apparatus 200 as shown in FIG. 10.

<Modified Examples of Horizontal Batch-Type Film Forming Apparatus>

Hereinafter, modified examples of the horizontal batch-type film forming apparatus will be described.

Figure 14A:
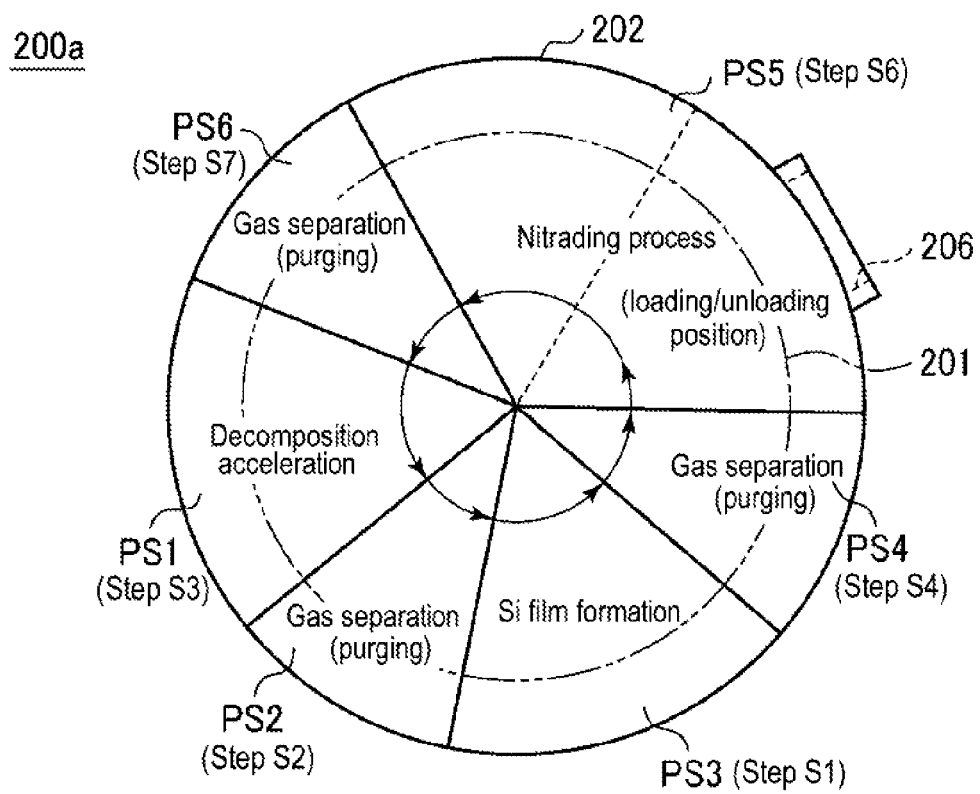
FIG. 14A is a view showing a processing stage in a film forming apparatus 200a according to a first modified example.
Figure 14B:
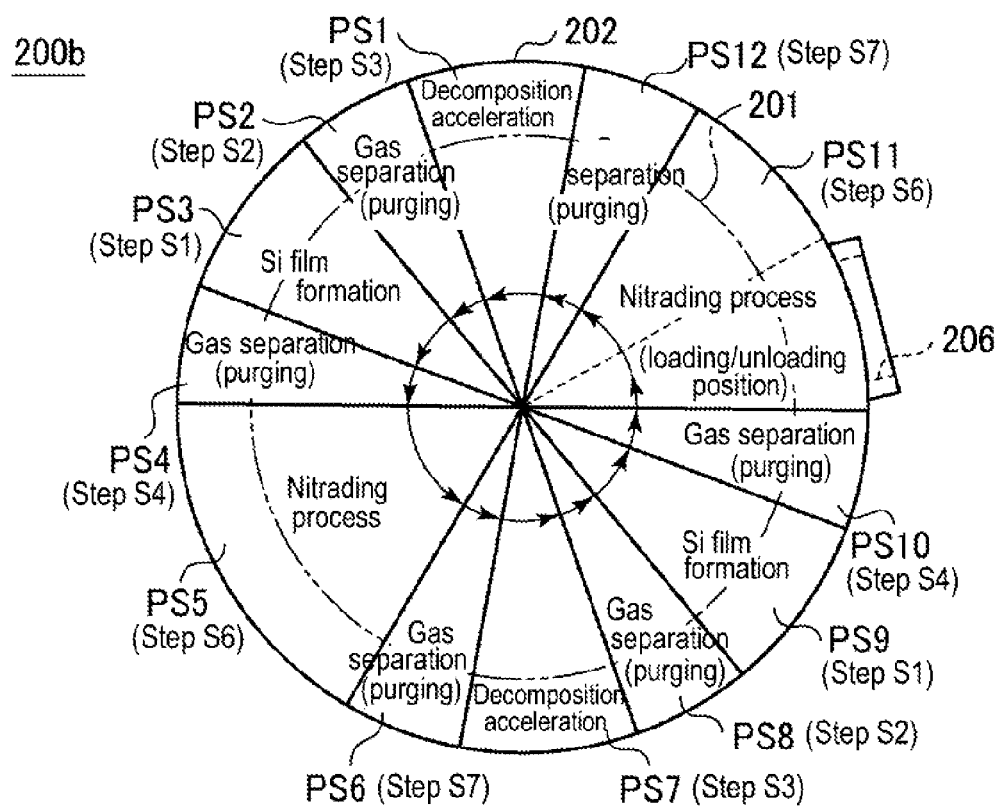
FIG. 14B is a view showing a processing stage in a film forming apparatus 200b according to a second modified example.
Figure 14C:
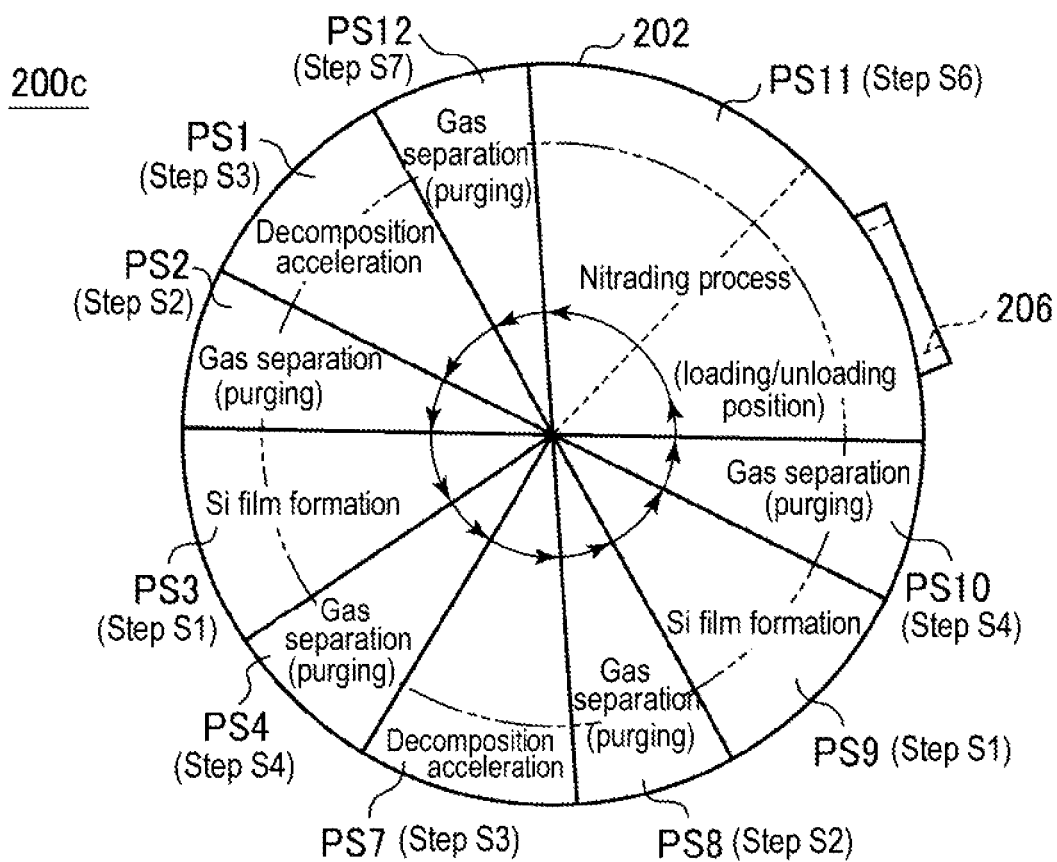
FIG. 14C is a view showing a processing stage in a film forming apparatus 200c according to a third modified example.

FIG. 14A is a view showing a processing stage in a horizontal batch-type film forming apparatus 200a according to a first modified example, FIG. 14B is a view showing a processing stage in another horizontal batch-type film forming apparatus 200b according to a second modified example, and FIG. 14C is a view showing a processing stage in another horizontal batch-type film forming apparatus 200c according to a third modified example.

As shown in FIG. 14A, in the horizontal batch-type film forming apparatus 200a, the interior of the processing chamber 202 is divided into six processing stages PS1 to PS6. Once the turntable 201 rotates one time, the one cycle including the silicon film forming process (the sequence of steps S3→S2→S1→S4) and the silicon film nitridation process (the sequence of steps S6→S7) is carried out. That is, in the horizontal batch-type film forming apparatus 200, one rotation of the turntable 201 corresponds to the one cycle.

Meanwhile, in the horizontal batch-type film forming apparatus 200b shown in FIG. 14B, the interior of the processing chamber 202 is divided into 12 processing stages (PS1 to PS12) such that the first to seventh processing stages PS1 to PS7 are repeated twice, compared with the horizontal batch-type film forming apparatus 200a shown in FIG. 14A. That is, in the horizontal batch-type film forming apparatus 200b, one rotation of the turntable 201 corresponds to 2 cycles.

As described above, the processing stages in the processing chamber 202 may be divided such that a plurality of cycles is carried out when the turntable 201 makes one rotation.

Further, in the horizontal batch-type film forming apparatus 200c shown in FIG. 14C, the fifth and sixth processing stages PS5 and PS6 are omitted once, compared with the horizontal batch-type film forming apparatus 200b shown in FIG. 14B. That is, the interior of the processing chamber 202 is divided into 10 processing stages PS1 to PS4 and PS7 to PS12. When the processing stages are divided in this manner, the predetermined set value n in the silicon film forming process shown in FIG. 7 is set to "2."

In this way, the processing stages of the processing chamber 202 may be divided such that a plurality of silicon film forming processes and a single silicon film nitridation process are performed when the turntable 201 makes one rotation.

As described above, according to the first and second embodiments of the present disclosure, it is possible to provide the silicon nitride film forming method capable of enhancing productivity of a film forming apparatus, while satisfying user demands such as film uniformity, and electrical or physical characteristics and processability, without relying only on hardware improvement, and the film forming apparatus configured to perform the film forming method.

While the present disclosure has been described according to the first and second embodiments, the present disclosure is not limited thereto. A variety of modifications may be made without departing from the spirit of the disclosures.

In the first and second embodiments, the specific processing conditions have been described, but are not limited thereto. Alternatively, the processing conditions may be arbitrarily changed depending on a volume of the processing chamber 101 or the like.

Further, while in the first and second embodiments, the film forming process has been described to be performed using the batch-type film forming apparatus, a single-sheet type film forming apparatus may be used therefor. Also, the batch-type film forming apparatus is not limited to the vertical one, but may be a horizontal batch-type film forming apparatus.

According to the present disclosure in some embodiments, it is possible to provide a silicon nitride film forming method capable of enhancing productivity of a film forming apparatus, while satisfying user demands such as film uniformity, and electrical or physical characteristics and processability, without relying only on hardware improvement, and a film forming apparatus configured to perform the film forming method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon nitride film on a surface to be processed of a target object, the method comprising:
   repeating a first process a first predetermined number of times, the process including supplying a silicon source gas containing silicon toward the surface to be processed and supplying a decomposition accelerating gas containing a material for accelerating decomposition of the silicon source gas toward the surface to be processed;
   performing a second process of supplying a nitriding gas containing nitrogen toward the surface to be processed a second predetermined number of times; and
   performing one cycle a third predetermined number of times, the one cycle being a sequence including the repetition of the first process and the performance of the second process to form the silicon nitride film on the surface to be processed,
   wherein the first predetermined number is equal to or greater than 2, and the second and third predetermined numbers are equal to or greater than 1.

2. The method of claim 1, wherein repeating a first process is performed at a temperature ranging from an adsorption initiation temperature at which the adsorption of the silicon onto the surface to be processed initiates to a chemical vapor deposition (CVD) growth initiation temperature at which a CVD growth of the silicon initiates.

3. The method of claim 2, wherein repeating a first process is performed at a temperature ranging from 100 degrees C. to 400 degrees C.

4. The method of claim 1, wherein repeating a first process is performed at a temperature ranging from an adsorption initiation temperature at which the adsorption of the silicon onto the surface to be processed initiates to a CVD growth transition initiation temperature at which a transition of the silicon to a CVD growth initiates.

5. The method of claim 4, wherein repeating a first process is performed by the adsorption of the silicon.

6. The method of claim 4, wherein repeating a first process is performed at a temperature ranging from 100 degrees C. to than 300 degrees C.

7. The method of claim 1, wherein the decomposition accelerating gas contains none of a halogen element.

8. The method of claim 1, wherein the material for accelerating decomposition of the silicon source gas includes boron.

9. The method of claim 8, wherein the decomposition accelerating gas includes a borane-based gas.

10. The method of claim 8, wherein the silicon nitride film is formed by supplying the decomposition accelerating gas in which a content of the boron contained in the formed silicon nitride film is less than 1%, toward the surface to be processed.

11. The method of claim 8, wherein the silicon nitride film is formed as a boron-containing silicon nitride film, by supplying the decomposition accelerating gas in which a content of the boron contained in the formed silicon nitride film is 1% or more, toward the surface to be processed.

12. The method of claim 1, wherein the silicon source gas contains no halogen element.

13. The method of claim 1, wherein the silicon source gas includes a silane-based gas.

14. The method of claim 1, wherein repeating a first process and performing a second process are performed at the same temperature.

15. The method of claim 1, further comprising:
    applying energy to the nitriding gas to generate an active nitrogen; and
    supplying the active nitrogen toward the surface to be processed.

16. A method of forming a silicon nitride film on a surface to be processed of a target object, the method comprising:
    supplying a decomposition accelerating gas toward the surface to be processed, and supplying a silicon source gas containing silicon toward the surface to be processed, the decomposition accelerating gas containing a material for accelerating decomposition of the silicon source gas;
    supplying a nitriding gas containing nitrogen toward the surface to be processed; and
    performing one cycle a predetermined number of times, the one cycle being a sequence including the supply of the decomposition accelerating gas and the silicon source gas and the supply of the nitriding gas to form the silicon nitride film on the surface to be processed,
    wherein the supply of the decomposition accelerating gas and the silicon source gas is performed equal to or greater than twice, and the supply of the nitriding gas is performed at least once.

\* \* \* \* \*